(12) United States Patent
Tashiro

(10) Patent No.: US 10,728,471 B2
(45) Date of Patent: Jul. 28, 2020

(54) PHOTOELECTRIC CONVERSION DEVICE WITH A VOLTAGE CONTROL UNIT CONNECTED TO A RESET TRANSISTOR AND A CAPACITIVE ELEMENT, AND ASSOCIATED IMAGING SYSTEM

(71) Applicant: CANON KABUSHIKI KAISHA, Tokyo (JP)

(72) Inventor: Kazuaki Tashiro, Isehara (JP)

(73) Assignee: Canon Kabushiki Kaisha, Tokyo (JP)

(*) Notice: Subject to any disclaimer, the term of this patent is extended or adjusted under 35 U.S.C. 154(b) by 11 days.

(21) Appl. No.: 15/845,995

(22) Filed: Dec. 18, 2017

(65) Prior Publication Data

US 2018/0184017 A1 Jun. 28, 2018

(30) Foreign Application Priority Data

Dec. 27, 2016 (JP) ................. 2016-254364

(51) Int. Cl.
*H04N 5/345* (2011.01)
*H01L 27/146* (2006.01)
*H04N 5/3745* (2011.01)
*G01C 3/08* (2006.01)
*H04N 5/353* (2011.01)
*H04N 5/378* (2011.01)
(Continued)

(52) U.S. Cl.
CPC ............. *H04N 5/345* (2013.01); *G01C 3/085* (2013.01); *H01L 27/1461* (2013.01); *H01L 27/14609* (2013.01); *H01L 27/14612* (2013.01); *H01L 27/14627* (2013.01); *H01L 27/14636* (2013.01); *H01L 27/14643* (2013.01); *H04N 5/353* (2013.01); *H04N 5/374* (2013.01); *H04N 5/378* (2013.01); *H04N 5/37457* (2013.01); *B60W 30/09* (2013.01); *B60W 2420/42* (2013.01); *B60W 2554/00* (2020.02)

(58) Field of Classification Search
CPC ......................... H01L 27/14603–14607; H01L 27/14609–14616; H01L 27/14636; H01L 27/14643–14656; H01L 27/14665–14676; H01L 27/307; H01L 27/1461; H04N 5/351–3537; H04N 5/357–367; H04N 5/369–378
See application file for complete search history.

(56) References Cited

U.S. PATENT DOCUMENTS

2006/0119720 A1* 6/2006 Hong ................ H01L 27/14609 348/308
2007/0035649 A1* 2/2007 McKee ............. H01L 27/14609 348/308
(Continued)

FOREIGN PATENT DOCUMENTS

JP 2013030820 A 2/2013
JP 2016127265 A 7/2016
(Continued)

*Primary Examiner* — Younes Boulghassoul
(74) *Attorney, Agent, or Firm* — Canon U.S.A., Inc. IP Division

(57) ABSTRACT

A photoelectric conversion device includes a voltage control unit connected to a first node of a capacitive element and a transistor via the same piece of wiring and configured to output a plurality of voltages having different values to the same piece of wiring.

10 Claims, 23 Drawing Sheets

(51) Int. Cl.
*H04N 5/374* (2011.01)
*B60W 30/09* (2012.01)

(56) References Cited

U.S. PATENT DOCUMENTS

| | | | |
|---|---|---|---|
| 2012/0200752 A1* | 8/2012 | Matsunaga | H01L 27/14609 348/300 |
| 2015/0041865 A1* | 2/2015 | Storm | H04N 5/355 257/229 |
| 2015/0076327 A1* | 3/2015 | Amikawa | H04N 5/355 250/208.1 |
| 2015/0340401 A1* | 11/2015 | Yoshii | H01L 27/14612 257/43 |
| 2016/0013328 A1* | 1/2016 | Tashiro | H01L 31/0224 250/208.1 |
| 2016/0035772 A1* | 2/2016 | Yamashita | H01L 27/14643 257/432 |
| 2016/0035780 A1* | 2/2016 | Itahashi | H01L 27/14665 348/294 |
| 2016/0035920 A1* | 2/2016 | Tashiro | H04N 5/3575 250/208.1 |
| 2016/0037117 A1* | 2/2016 | Ono | H04N 5/2173 348/308 |
| 2016/0112665 A1* | 4/2016 | Meynants | H01L 27/14609 250/208.1 |
| 2016/0190188 A1* | 6/2016 | Murakami | H01L 27/14609 250/214 A |
| 2016/0191825 A1* | 6/2016 | Sato | H04N 5/363 348/250 |
| 2016/0293654 A1* | 10/2016 | Tomekawa | H01L 27/14643 |
| 2017/0154908 A1* | 6/2017 | Tashiro | H04N 5/3745 |
| 2017/0162616 A1* | 6/2017 | Tashiro | H01L 27/14645 |
| 2017/0162617 A1* | 6/2017 | Takahashi | H01L 27/14645 |
| 2017/0250216 A1* | 8/2017 | Sato | H01L 27/14665 |
| 2017/0373107 A1* | 12/2017 | Koga | H01L 27/146 |
| 2018/0151620 A1* | 5/2018 | Tashiro | H04N 5/374 |
| 2018/0152652 A1* | 5/2018 | Tashiro | H04N 5/3532 |
| 2019/0027528 A1* | 1/2019 | Yoshida | H01L 31/0224 |
| 2019/0067612 A1* | 2/2019 | Tashiro | H01L 51/4293 |

FOREIGN PATENT DOCUMENTS

| | | |
|---|---|---|
| JP | 2016152495 A | 8/2016 |
| WO | 2011058684 A1 | 5/2011 |

\* cited by examiner

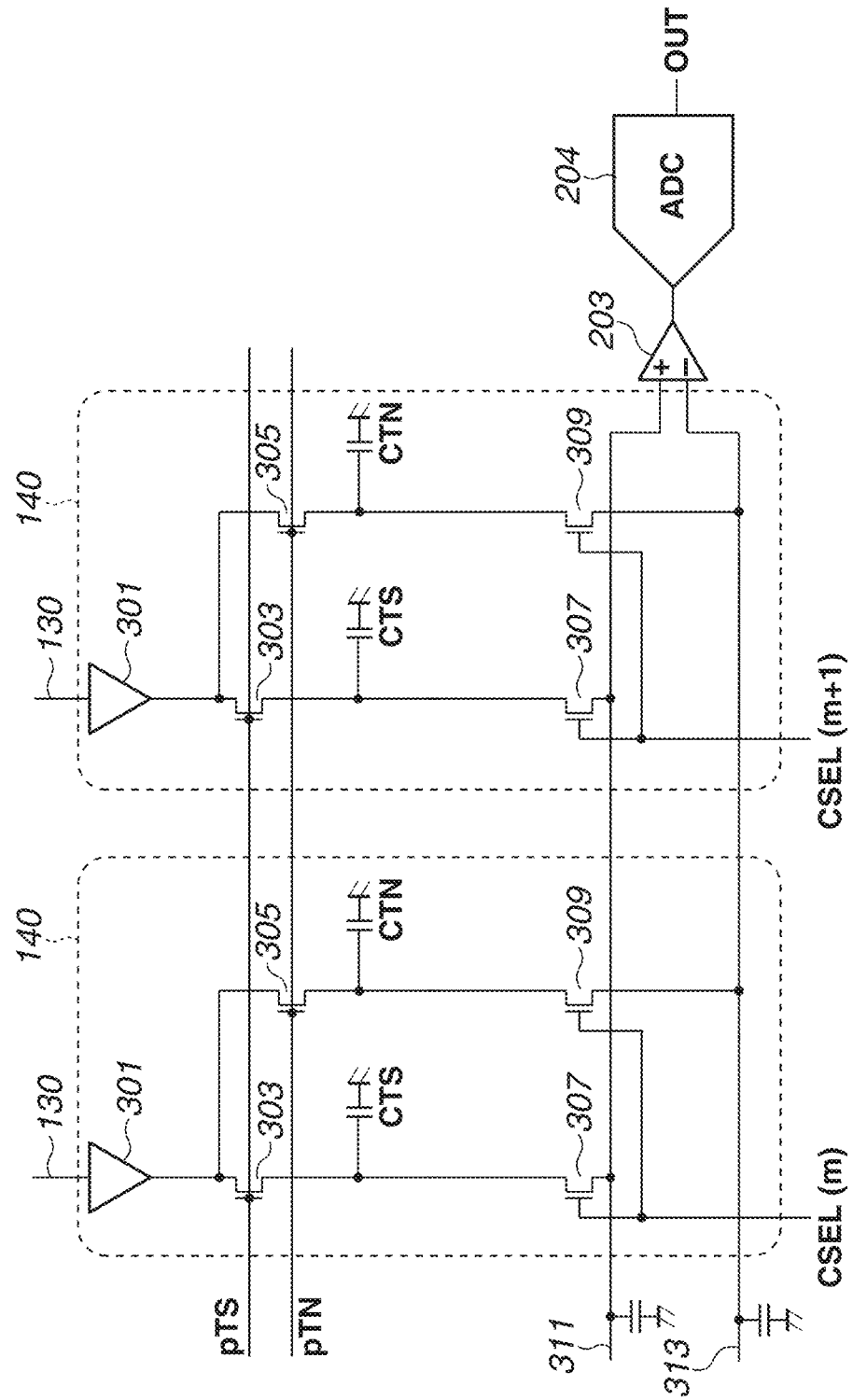

PHOTOELECTRIC CONVERSION MODE

B MODE

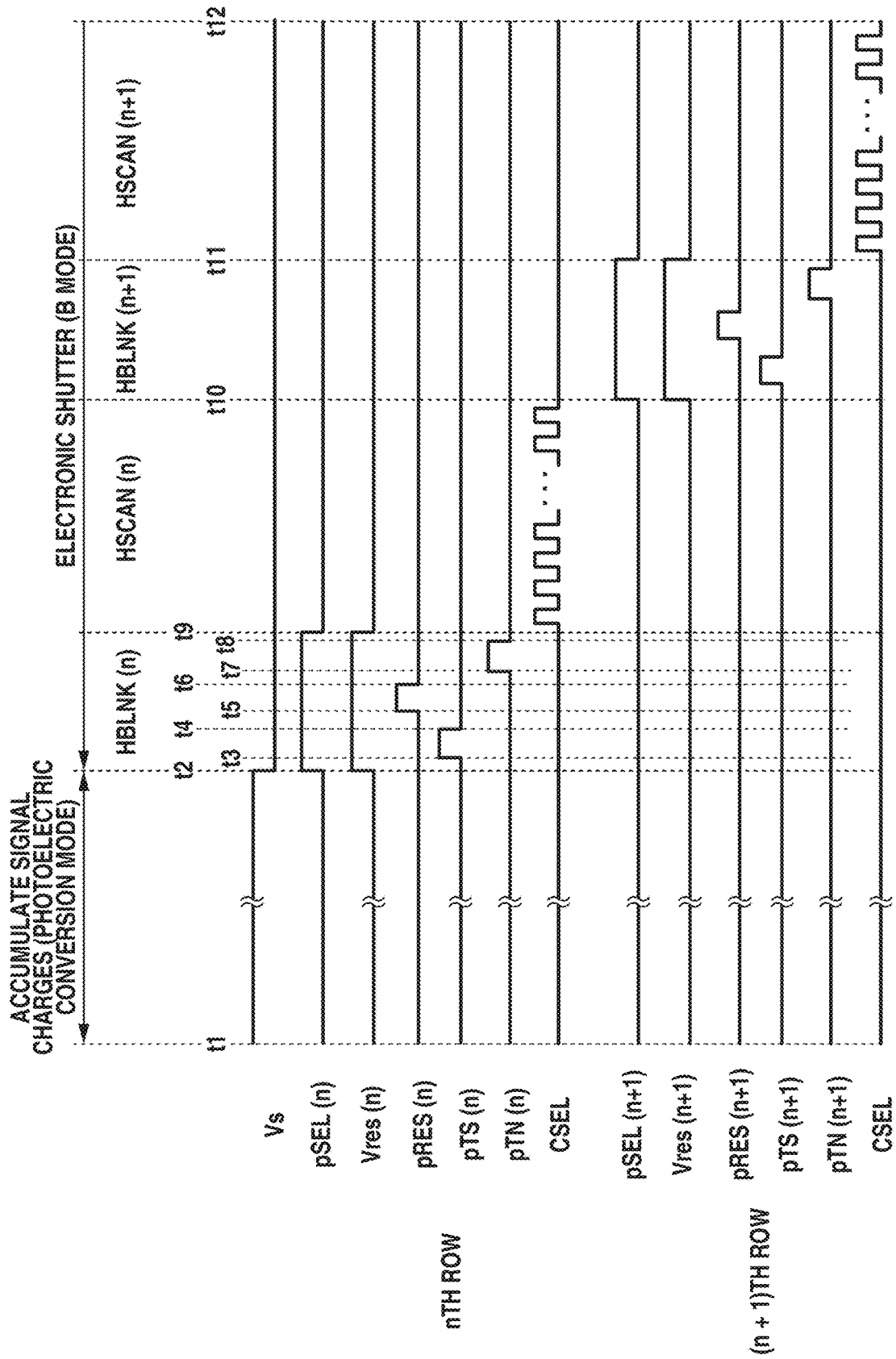

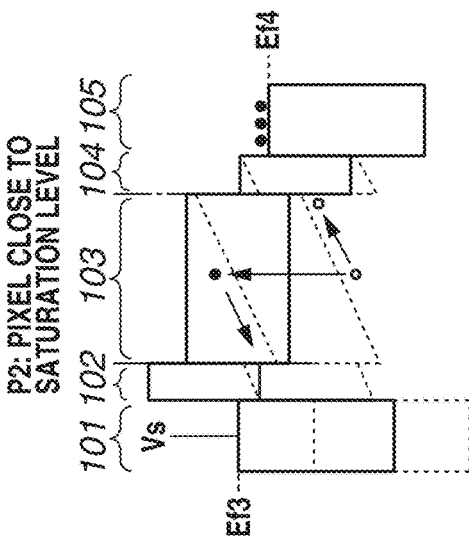
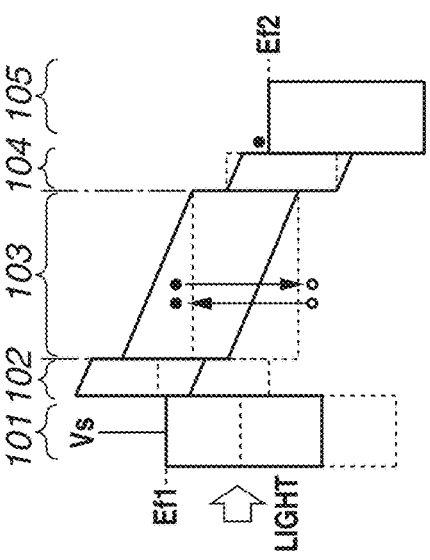
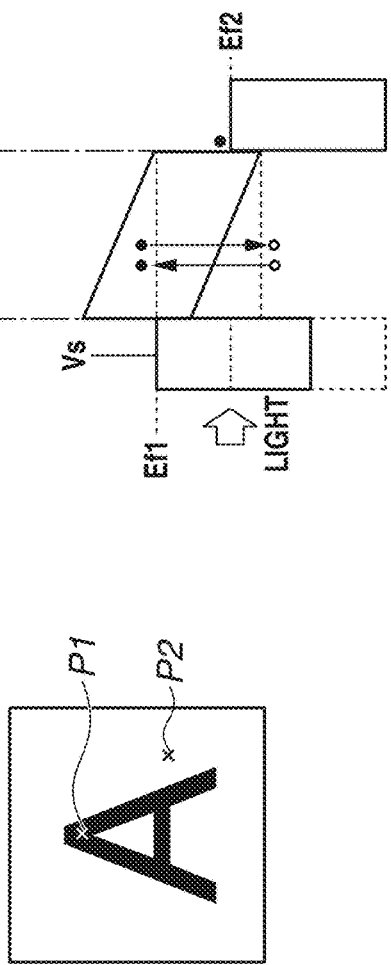

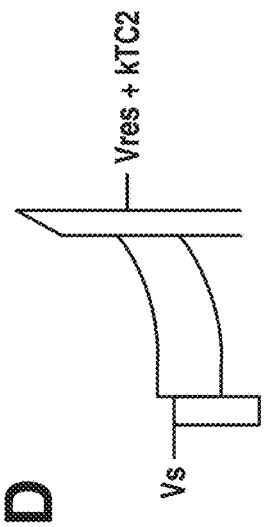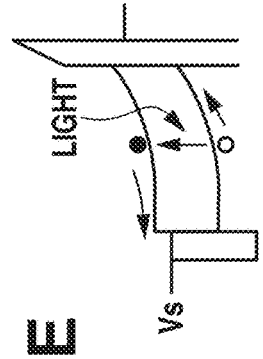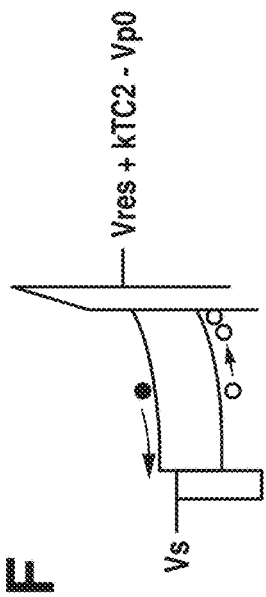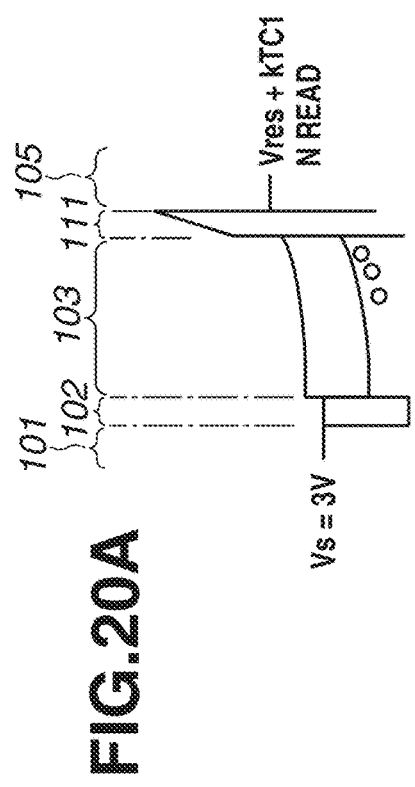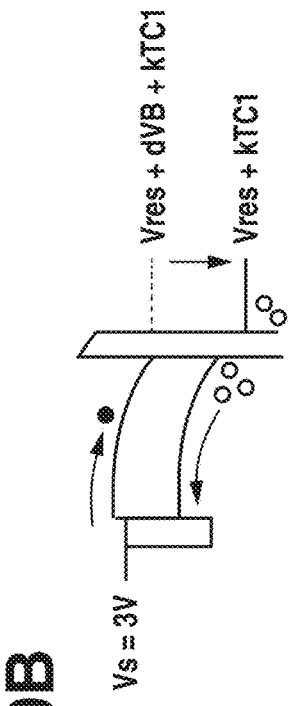
FIG.20A FIG.20B FIG.20C FIG.20D FIG.20E FIG.20F

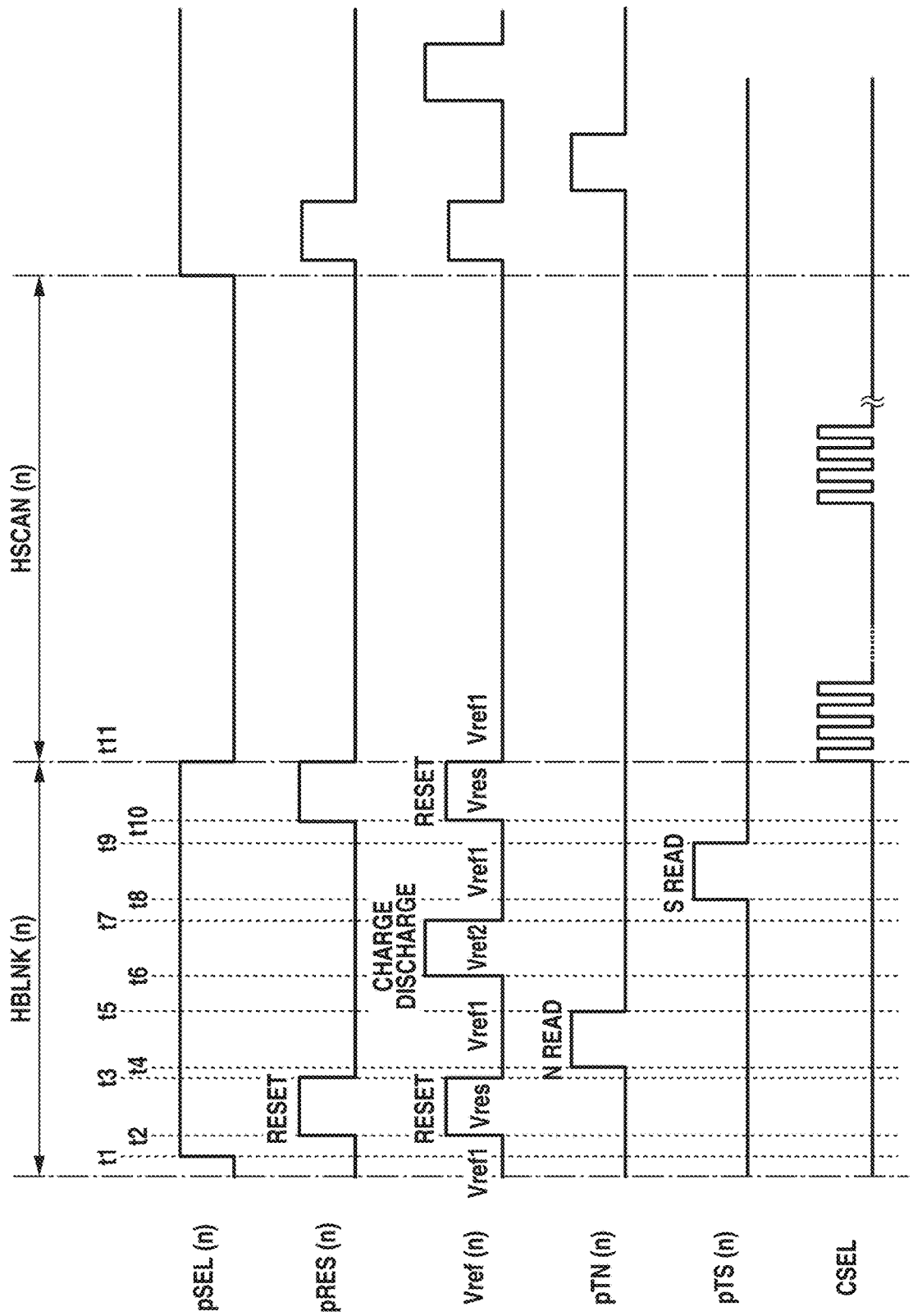

PHOTOELECTRIC CONVERSION DEVICE
WITH A VOLTAGE CONTROL UNIT
CONNECTED TO A RESET TRANSISTOR
AND A CAPACITIVE ELEMENT, AND
ASSOCIATED IMAGING SYSTEM

BACKGROUND

Field of the Disclosure

The present disclosure relates to a photoelectric conversion device and an imaging system.

Description of the Related Art

A stacked photoelectric conversion device has been discussed as a photoelectric conversion device used for an image sensor of a camera. WO 2011/058684 discusses a photoelectric conversion device which includes a photoelectric conversion layer stacked on a semiconductor substrate. Upper electrodes are arranged on an incident surface side of the photoelectric conversion layer. Pixel electrodes are arranged on the semiconductor substrate side of the photoelectric conversion layer. WO 2011/058684 discusses controlling a reset voltage of the pixel electrodes by using reset transistors and reset control capacitors.

SUMMARY

According to an aspect of the present disclosure, a photoelectric conversion device includes a semiconductor substrate, and a pixel, the pixel including a photoelectric conversion unit including a first electrode, a second electrode arranged between the first electrode and the semiconductor substrate, and a photoelectric conversion layer arranged between the first electrode and the second electrode, an amplification transistor, an impurity diffusion portion connected to the second electrode and a gate of the amplification transistor, a reset transistor configured to, if turned on, reset a voltage of the impurity diffusion portion, and a capacitive element including a first node and a second node, the first node being connected to the impurity diffusion portion, wherein the photoelectric conversion device further comprises a voltage control unit connected to the second node and the reset transistor via a piece of wiring and configured to output a plurality of voltages having different values to the piece of wiring, and wherein the amplification transistor is switched on and off by input of the plurality of voltages to the impurity diffusion portion via the reset transistor.

Further features of the present disclosure will become apparent from the following description of exemplary embodiments with reference to the attached drawings.

BRIEF DESCRIPTION OF THE DRAWINGS

FIG. 2 is a diagram illustrating a configuration of column circuits according to one or more aspects of the present disclosure.

FIG. 8 is a diagram illustrating an operation of pixels according to one or more aspects of the present disclosure.

FIGS. 9A, 9B, 9C, 9D, and 9E are diagrams illustrating energy band states according to luminance of a subject and an operation of photoelectric conversion units and one or more aspects of the present disclosure.

FIGS. 20A, 20B, 20C, 20D, 20E, and 20F are diagrams illustrating an operation of a photoelectric conversion unit according to one or more aspects of the present disclosure.

FIG. 21 is a diagram illustrating an operation of pixels according to one or more aspects of the present disclosure.

DESCRIPTION OF THE EMBODIMENTS

The photoelectric conversion device discussed in WO 2011/058684 includes control lines for controlling the reset control capacitors aside from wiring connected to transistors for driving pixels. Such a configuration increases the circuit area of pixel regions.

Examples of a photoelectric conversion device which outputs a signal with reduced noise while suppressing an increase in the circuit area of the pixel regions will be described below.

An exemplary embodiment according to the present disclosure is a photoelectric conversion device. The photoelectric conversion device includes a semiconductor substrate and a photoelectric conversion layer stacked on the semiconductor substrate. The photoelectric conversion layer is configured to photoelectrically convert light incident on the photoelectric conversion layer into a charge. A circuit unit for receiving a signal based on a signal charge occurring in the photoelectric conversion layer is arranged on the semiconductor substrate. In some exemplary embodiments, the photoelectric conversion device includes a plurality of pixels. In such exemplary embodiments, a plurality of circuit units is arranged to correspond to the plurality of pixels. The plurality of circuit units may each include an amplification unit for amplifying a signal.

Figure 3A:
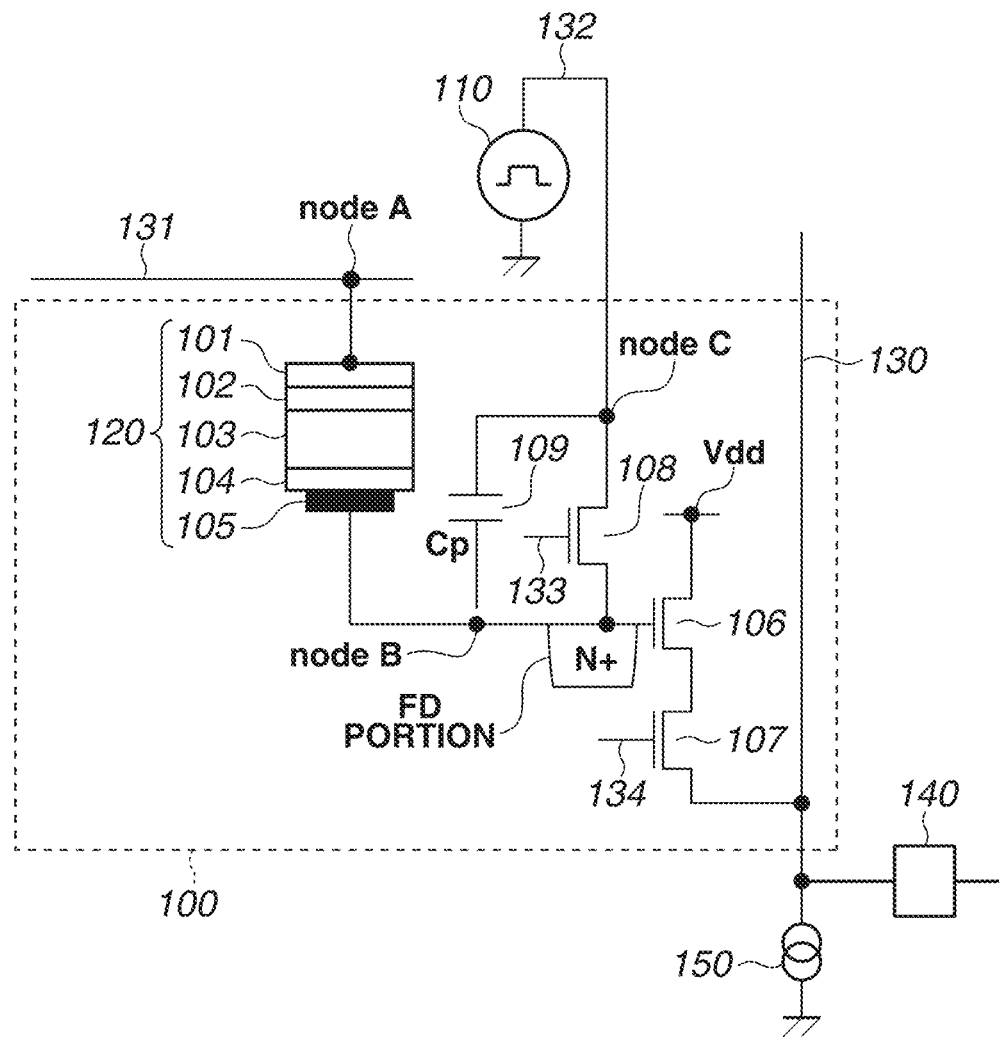
FIGS. 3A and 3B are diagrams illustrating a configuration of a pixel according to one or more aspects of the present disclosure.
Figure 5:
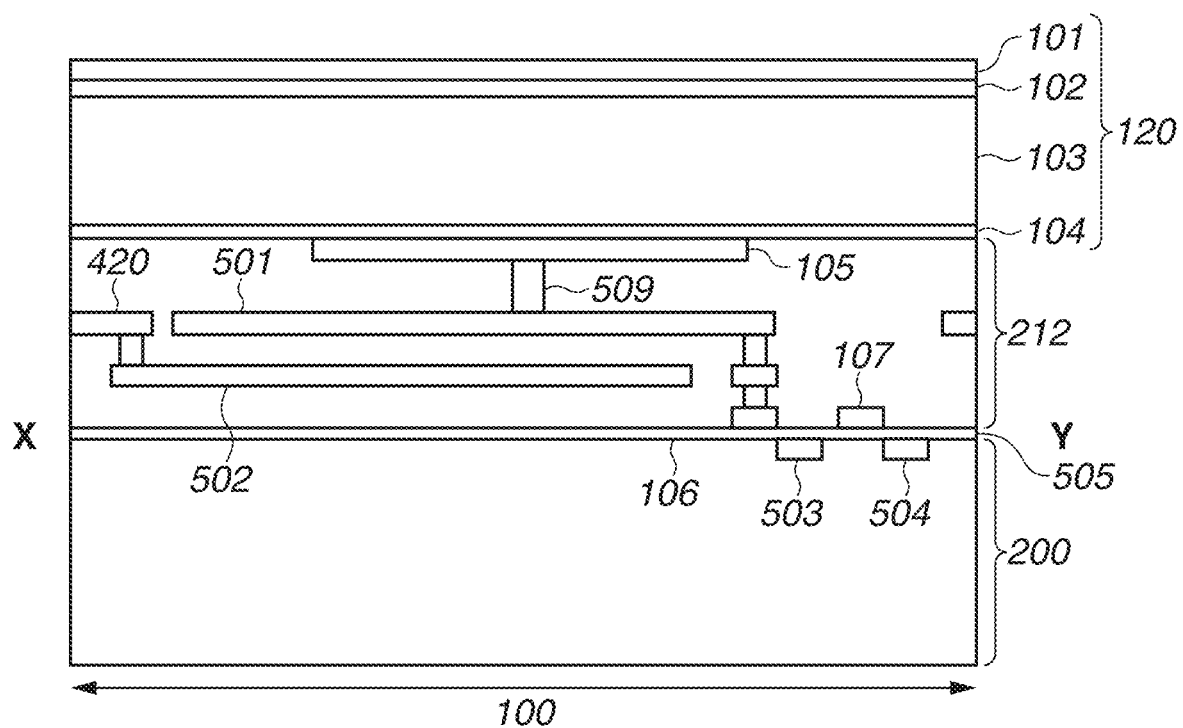
FIG. 5 is a diagram illustrating a sectional layout of a pixel according to one or more aspects of the present disclosure.

FIG. 3A illustrates an equivalent circuit of a pixel 100 of the photoelectric conversion device. FIG. 5 schematically illustrates a sectional structure of the pixel 100 of the photoelectric conversion device.

In FIG. 5, an upper electrode 101 which is a first electrode is arranged on a semiconductor substrate 200. A pixel electrode 105 which is a second electrode is arranged between the upper electrode 101 and the semiconductor substrate 200. A second blocking layer 102 is arranged between the upper electrode 101 and the pixel electrode 105. A photoelectric conversion layer 103 is arranged under the second blocking layer 102. A first blocking layer 104 is arranged under the photoelectric conversion layer 103.

Suppose that the photoelectric conversion layer 103 accumulates holes corresponding to incident light. The second blocking layer 102 suppresses injection of holes from the upper electrode 101 into the pixel electrode 105. In other words, the second blocking layer 102 suppresses injection of a charge having the same polarity as that of the charge accumulated in the photoelectric conversion layer 103 from the upper electrode 101 into the photoelectric conversion layer 103.

Exemplary embodiments of the present disclosure will be described in detail below with reference to the drawings. The present disclosure is not limited to the exemplary embodiments described below. Modifications obtained by modifying part of the configuration of the following exemplary embodiments without departing from the gist of the present disclosure also constitute exemplary embodiments of the present disclosure. Examples obtained by adding part of the configuration of any one of the following exemplary embodiments to another exemplary embodiment or by replacing part of the configuration of any one of the following exemplary embodiments with part of the configuration of another exemplary embodiment also constitute exemplary embodiments of the present disclosure.

A photoelectric conversion device according to a first exemplary embodiment will be described with reference to the drawings.

(Configuration of Photoelectric Conversion Device)

Figure 1:
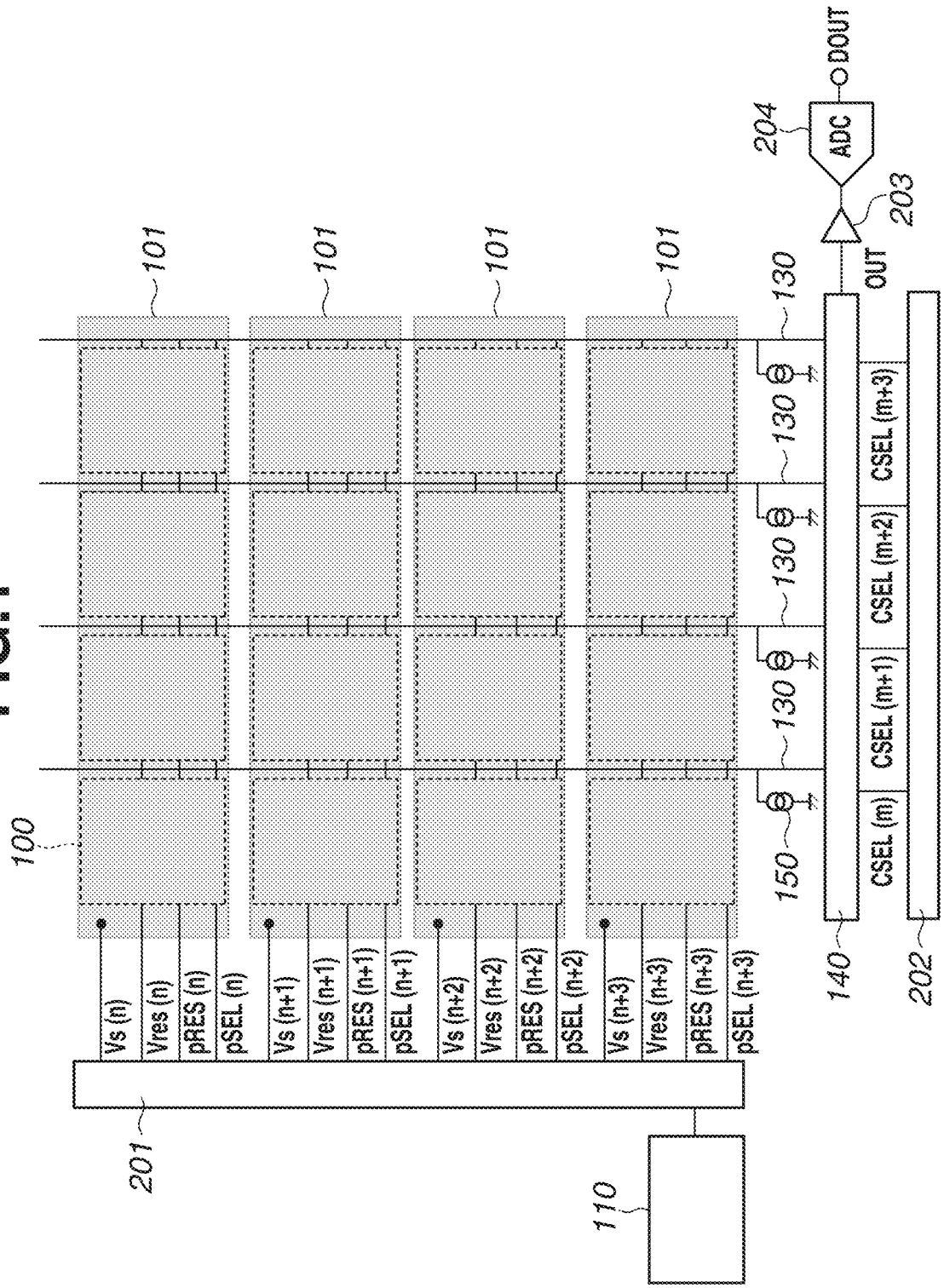
FIG. 1 is a diagram illustrating a configuration of a photoelectric conversion device according to one or more aspects of the present disclosure.

FIG. 1 is a diagram illustrating an entire circuit configuration of the photoelectric conversion device according to the present exemplary embodiment, along with a layout of upper electrodes 101.

FIG. 1 illustrates 16 pixels 100 arranged in a matrix with four rows and four columns, as part of pixels 100 arranged in a plurality of rows and a plurality of columns. While the present exemplary embodiment deals with the matrix with four rows and four columns, the numbers of rows and columns are not limited thereto. A plurality of pixels 100 included in a column is connected to an output line 130. An output line 130 is connected with a current source 150. The current source 150 supplies a current to the pixels 100. The pixels 100 output a pixel signal to the output line 130. The pixel signal includes a light signal which is a signal based on incident light, and a noise signal which mainly contains noise components of the pixels 100.

The photoelectric conversion device includes a voltage control unit 110 and a row driving circuit 201. The voltage control unit 110 supplies a reference voltage which is used to generate an electrode driving voltage Vs for the row driving circuit 201 to supply. The row driving circuit 201 supplies the electrode driving voltage Vs, a reset signal pRES, and a driving signal pSEL. A plurality of pixels 100 included in a row is connected to the same reset signal line and the same driving signal line. Reset signal lines are wiring for transmitting the reset signal pRES. Driving signal lines are wiring for transmitting the driving signal pSEL. In FIG. 1, symbols representing the rows, such as (n) and (n+1), are attached to the ends of the signal names to distinguish the driving signals supplied to different rows. The same applies to the other drawings.

FIG. 1 schematically illustrates a planar structure of the upper electrodes 101. An upper electrode 101 is provided to correspond to a row of pixels 100. In the present exemplary embodiment, the upper electrodes 101 are arranged for the respective rows. The row driving circuit 201 supplies the electrode driving voltage Vs in units of rows. The electrode driving voltage Vs includes a first voltage and a second voltage having a voltage value different from that of the first voltage. The row driving circuit 201 is a voltage supply unit for supplying a plurality of voltages having different values to the upper electrodes 101. Symbols representing the rows, such as (n) and (n+1), are attached to distinguish the electrode driving voltages Vs supplied to different rows.

The photoelectric conversion device includes column circuits 140. For the sake of simplicity, in FIG. 1, the column circuits 140 for the plurality of columns are illustrated as a single block. In fact, one column circuit 140 is provided for one output line 130.

A column driving circuit 202 supplies a driving signal CSEL to the plurality of column circuits 140. The column driving circuit 202 sequentially turns the driving signal CSEL to an active level from one column circuit 140 to another. The column driving circuit 202 thereby drives the column circuits 140 column by column. Symbols representing the columns, such as (m) and (m+1), are attached to distinguish the driving signals CSEL supplied to different columns. The same applies to the other drawings.

The column driving circuit 202 causes each of the plurality of column circuits 140 to output a signal to the output amplifier unit 203. The output amplifier unit 203 amplifies and outputs the input signal to an analog-to-digital (AD) conversion unit 204. The AD conversion unit 204 outputs a digital signal obtained by converting the input signal to outside the photoelectric conversion device as a signal DOUT.

(Configuration of Column Circuits)

FIG. 2 is a diagram illustrating an equivalent circuit of column circuits 140 in mth and (m+1)th columns. The column circuits 140 illustrated in FIG. 2 correspond to two columns of the column circuits 140 illustrated in FIG. 1.

The pixel signals output to the output lines 130 are amplified by column amplifiers 301. Output nodes of the column amplifiers 301 are connected to capacitors CTS via sample-and-hold (S/H) switches 303. The output nodes of the column amplifiers 301 are also connected to capacitors CTN via S/H switches 305. The S/H switches 303 and the S/H switches 305 are controlled by a driving signal pTS and a driving signal pTN output from a not-illustrated timing generator, respectively. With such a configuration, the capacitors CTN hold signals based on the noise signals output from the pixels 100. The capacitors CTS holds the light signals which include the noise signals as part of their components.

The capacitors CTS are connected to a horizontal output line 311 via horizontal transfer switches 307. The capacitors CTN are connected to a horizontal output line 313 via horizontal transfer switches 309. The horizontal transfer switches 307 and 309 are controlled by the driving signal CSEL from the column driving circuit 202.

The horizontal output lines 311 and 313 are both connected to the output amplifier unit 203. The output amplifier unit 203 outputs a difference between the signal of the horizontal output line 311 and the signal of the horizontal output line 313 to the AD conversion unit 204. The output amplifier unit 203 obtains a difference between the light signal and the noise signal. The output amplifier unit 203 can thus obtain a signal by subtracting the noise signal included in the light signal from the light signal. The AD conversion unit 204 converts the signal output from the output amplifier unit 203 into a digital signal.

In this example, the signals horizontally transferred from the column circuits 140 are subjected to the AD conversion. In another example, the column circuit 140 in each column may include an AD conversion unit. In such a case, the AD conversion unit includes a holding unit for holding digital signals corresponding to the pixel signal. Examples of the holding unit include a memory and a counter. The holding unit holds digital signals obtained by converting the noise signal and the light signal, respectively.

(Configuration of Pixels)

Figure 3B:
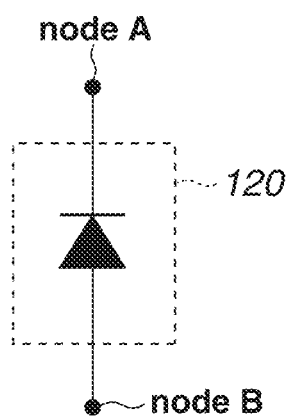

FIG. 3A is a diagram illustrating an equivalent circuit of a pixel 100 of the photoelectric conversion device, along with a schematic diagram of a photoelectric conversion unit 120. FIG. 3B is a diagram illustrating an equivalent circuit of the photoelectric conversion unit 120.

The pixel 100 illustrated in FIG. 3A corresponds to the pixels 100 illustrated in FIG. 1.

The pixel 100 includes the photoelectric conversion unit 120, an amplification transistor (source follower (SF) metal-oxide-semiconductor (MOS) transistor) 106, a selection transistor (selection (SEL) MOS transistor) 107, a reset transistor (reset (RES) MOS transistor) 108, and a floating diffusion (FD) portion which is an impurity diffusion portion.

The photoelectric conversion unit 120 includes an upper electrode 101, a photoelectric conversion layer 103, and a pixel electrode 105. The photoelectric conversion unit 120 further includes a first blocking layer 104 between the photoelectric conversion layer 103 and the pixel electrode 105. The photoelectric conversion unit 120 further includes a second blocking layer 102 between the photoelectric conversion layer 103 and the upper electrode 101.

The electrode driving voltage Vs is supplied to the upper electrode 101 from the row driving circuit 201 via a Vs line 131.

The first blocking layer 104 can be made of a semiconductor material. The semiconductor material can be selected from among inorganic semiconductor materials including silicon, germanium, and gallium arsenide, and organic semiconductor materials. The photoelectric conversion layer 103 and the first blocking layer 104 may be made of respective different semiconductor materials. Alternatively, the photoelectric conversion layer 103 and the first blocking layer 104 may be made of semiconductor materials having respective different bandgaps. The bandgap refers to a difference between the lowest energy level of the conduction band and the highest energy level of the valence band. The material of the first blocking layer 104 is not limited to semiconductor materials.

The photoelectric conversion layer 103 and the first blocking layer 104 may be made of the same semiconductor material. In such a case, the photoelectric conversion layer 103 and the first blocking layer 104 can be formed by changing the concentration of impurities with which the semiconductor material of the photoelectric conversion layer 103 and that of the first blocking layer 104 are doped.

In FIG. 3A, a node B is connected to the pixel electrode 105, one of the nodes of a capacitive element 109, and the FD portion which is an impurity diffusion portion. The capacitive element 109 has a capacitance value Cp.

In FIG. 3A, a node C is connected to the drain of the reset transistor 108 and the other node of the capacitive element 109. The gate of the reset transistor 108 is connected to a control line 133. The reset transistor 108 is further connected to the voltage control unit 110. The gate of the amplification transistor 106 serves as an input node of a pixel amplification unit. With such a configuration, the pixel amplification unit outputs a signal obtained by amplifying the signal from the photoelectric conversion unit 120 to the output line 130.

The drain of the amplification transistor 106 is connected to a node to which a power supply voltage Vdd (for example, 3.3 V) is supplied. The source of the amplification transistor 106 is connected to the output line 130 via the selection transistor 107. The gate of the selection transistor 107 is connected to a control line 134. If the selection transistor 107 is turned on, a current is supplied from the current source 150 to the amplification transistor 106 via the output line 130 and the selection transistor 107. The amplification transistor 106 and the current source 150 thus constitute a source follower circuit (pixel source follower circuit). The amplification transistor 106 constituting the source follower circuit outputs a signal corresponding to the signal from the photoelectric conversion unit 120 to the output line 130. The signal output from the amplification transistor 106 of the pixel 100 is input to the column circuit 140. In other words, the selection transistor 107 is a transistor for switching conduction and non-conduction of an electrical path between the amplification transistor 106 and the output line 130.

FIG. 3B illustrates an equivalent circuit of the photoelectric conversion unit 120. The photoelectric conversion unit 120 forms a photodiode having a first terminal connected to a node A of FIG. 3A and a second terminal connected to the node B.

(Configuration of Photoelectric Conversion Unit)

A specific configuration of the photoelectric conversion unit 120 of FIGS. 3A and 3B described above will be described in detail.

The first blocking layer 104, the photoelectric conversion layer 103, and the second blocking layer 102 according to the present exemplary embodiment may be configured to form a homojunction. In other words, the first blocking layer 104, the photoelectric conversion layer 103, and the second blocking layer 102 may be made of the same semiconductor materials. The "same semiconductor materials" refer to that the respective richest elements in the first blocking layer 104, the photoelectric conversion layer 103, and the second blocking layer 102 are the same. For example, suppose that the first blocking layer 104, the photoelectric conversion layer 103, and the second blocking layer 102 are each made of a semiconductor formed by doping silicon with impurities. In such a case, the respective richest elements in the first blocking layer 104, the photoelectric conversion layer 103, and the second blocking layer 102 are silicon. The first blocking layer 104, the photoelectric conversion layer 103, and the second blocking layer 102 can thus be said to be made of the "same semiconductor materials".

Semiconductor materials, compound semiconductors, and organic semiconductors can be used as the material constituting the photoelectric conversion layer 103. Examples of the semiconductor materials include intrinsic amorphous silicon, lightly doped P type amorphous silicon, and lightly doped N type amorphous silicon. Examples of the compound semiconductors include III-VI compound semiconductors such as BN, GaAs, GaP, AlSb, and GaAlAsP, and II-IV compound semiconductors such as CdSe, ZnS, and HdTe. Examples of the organic semiconductors include fullerene, coumarin 6 (C6), rhodamine 6G (R6G), quinacridone, phthalocyanine materials such as zinc phthalocyanine (ZnPc), and naphthalocyanine materials.

A layer including quantum dots made of the foregoing semiconductor materials may be used for the photoelectric conversion layer 103. Amorphous silicon films, organic semiconductor films, and quantum dot films can be easily formed as thin films. As employed herein, a quantum dot refers to a particle having a particle diameter of 20.0 nm or less.

Intrinsic semiconductors have a low carrier density. The use of an intrinsic semiconductor as the photoelectric conversion layer 103 can provide a large depletion layer width. A photoelectric conversion layer 103 having high sensitivity and reduced noise can thereby be achieved.

The upper electrode 101 is made of a material that transmits light incident via a not-illustrated microlens layer and a not-illustrated color filter layer to the photoelectric conversion layer 103. For example, a transparent electrode made of a compound or oxide containing indium and tin, such as ITO, may be used as the upper electrode 101. The use of a transparent electrode can suppress a drop in the amount of light of the incident light due to the transmission through the upper electrode 101, and can thus suppress a drop in the sensitivity of the photoelectric conversion unit 120. Other examples of the upper electrode 101 may include a film of polysilicon or metal as thin as a predetermined amount of light can be transmitted through. Since metal has an electric resistance lower than that of oxides, the use of metal as the material of the upper electrode 101 can reduce power consumption and enable high speed driving, compared to when the upper electrode 101 is made of an oxide.

If the first blocking layer 104, the photoelectric conversion layer 103, and the second blocking layer 102 are made of the "same semiconductor materials", the impurity concentrations in the respective semiconductor materials may be different. For example, the second blocking layer 102 is made of an N type semiconductor material. The photoelectric conversion layer 103 is made of an intrinsic semiconductor. The first blocking layer 104 is made of a P type semiconductor material. More specifically, the conductivity type (I type) of the photoelectric conversion layer 103 is different from the conductivity type (P type) of the first blocking layer 104 which is a blocking portion. The conductivity type (P type) of the first blocking layer 104 is different from the conductivity type (N type) of the second blocking layer 102.

The first blocking layer 104 may be made of a material different from that of the photoelectric conversion layer 103. In such a configuration, a heterojunction is formed between the first blocking layer 104 and the photoelectric conversion layer 103. The difference between the material of the first blocking layer 104 and that of the photoelectric conversion layer 103 generates an energy barrier between the first blocking layer 104 and the photoelectric conversion layer 103. The heterojunction can thus suppress (block) the injection of a charge having a polarity opposite to that of the signal charge from the photoelectric conversion layer 103 into the pixel electrode 105. As employed herein, "different materials" refer to that the main elements constituting the layers are different.

Alternatively, the second blocking layer 102 may be made of a material different from that of the photoelectric conversion layer 103. With such a configuration, a heterojunction is formed. Since the different materials provide different bandgaps, a potential barrier can be formed against either electrons or holes only.

The second blocking layer 102 and the first blocking layer 104 are configured so that the photoelectric conversion unit 120 has a diode characteristic. More specifically, if the second blocking layer 102 is made of an N type semiconductor, the first blocking layer 104 is made of a P type semiconductor. In such a case, holes are used as the signal charge.

The pixel electrode 105 is made of a conductive member such as metal. The pixel electrode 105 is made of the same material as that of a conductive member constituting wiring or that of a conductive member constituting a pad electrode for external connection. With such a configuration, the pixel electrode 105 and the conductive member constituting the wiring or the pad electrode can be simultaneously formed. This can simplify the manufacturing processes.

(Description of Planar Structure and Sectional Structure of Pixels)

Next, a planar structure and sectional structure of the photoelectric conversion device according to the present exemplary embodiment will be described.

Figure 4:
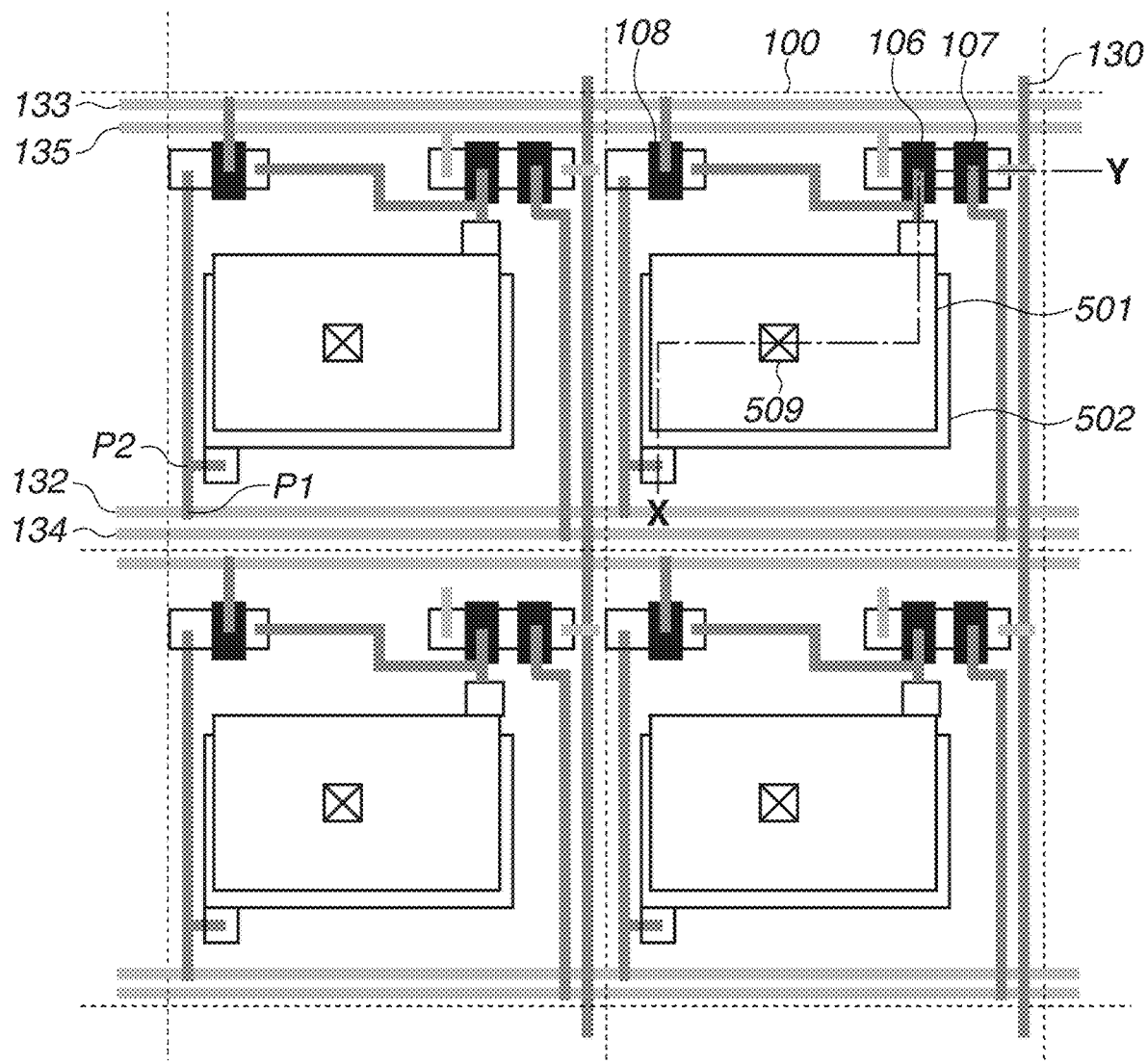
FIG. 4 is a diagram illustrating a planar layout of pixels according to one or more aspects of the present disclosure.

FIG. 4 schematically illustrates a planar structure of four pixels 100 arranged in a matrix with two rows and two columns. The other pixels 100 have a similar planar structure. Here, the photoelectric conversion units 120 stacked above the pixel electrodes 105 are omitted.

FIG. 5 schematically illustrates a sectional structure of a pixel 100 of the photoelectric conversion device, taken along the dashed dotted line X-Y in FIG. 4. Portions having similar functions to those of FIG. 1 are designated by the same reference numerals. The reference numerals of the transistors are attached to the respective corresponding gate electrodes. In FIG. 5, the photoelectric conversion unit 120 stacked above the pixel electrode 105 is illustrated as well.

The structures of the pixels 100 will be described below with reference to FIGS. 4 and 5. The photoelectric conversion device includes the semiconductor substrate 200. In the present exemplary embodiment, the semiconductor substrate 200 is made of a P type semiconductor. Not-illustrated N+ type impurity semiconductor regions (impurity diffusion portions) including source regions and drain regions of pixel transistors are arranged in the semiconductor substrate 200. Examples of the pixel transistors include the amplification transistor 106, the selection transistor 107, and the reset transistor 108. The gate electrodes of the pixel transistors and a plurality of wiring layers 212 including conductive members constituting wiring are arranged on the semiconductor substrate 200. A first node 501 is either one of the nodes of the capacitive element 109 for performing zero bias driving of a pixel electrode portion. A second node 502 is the other node. The capacitive element 109 includes the first node 501, the second node 502, and an interlayer insulation layer arranged therebetween. The first node 501 is connected to the pixel electrode 105 via the connecting portion 509 (ex.

via plug). The second node 502 is connected to the reset transistor 108 via the connecting portion 420. The selection transistor includes semiconductor regions 503, 504. The gate insulating film 505 is arranged between the gate of each of the pixel transistors and semiconductor regions.

In FIG. 4, a reset voltage Vres is supplied to the drains of the reset transistors 108 and the second nodes 502 of the capacitive elements 109 by wiring that branches off from voltage control lines 132. Specifically, wiring to the pixels 100 branches off from the voltage control lines 132 at branching points P1. The wiring also branches out to the drains of the reset transistors 108 and the second nodes 502 of the capacitive elements 109 at branching points P2. In such a manner, the photoelectric conversion device according to the present exemplary embodiment is configured so that a voltage control line 132 branches out inside the regions of the respective pixels 100. The provision of the branching points P2 can make common the wiring for supplying the voltage to the reset transistors 108 and the capacitive elements 109. The photoelectric conversion device according to the present exemplary embodiment can thus reduce the number of voltage control lines 132 laid across a plurality of pixels 100 that is arranged in a row and in a plurality of columns. If the voltage control unit 110 includes buffer circuits for outputting a voltage to the voltage control lines 132, the number of buffer circuits can also be reduced since the number of voltage control lines 132 in the photoelectric conversion device according to the present exemplary embodiment can be reduced.

In the present exemplary embodiment, the power supply voltage Vdd is supplied from power supply lines (Vdd lines) 135 to the pixels 100 in the respective rows. In another example, the electrode driving voltage Vs supplied to the upper electrodes 101 may serve as the power supply voltage Vdd. The power supply lines 135 for supplying the power supply voltage Vdd can thus be omitted. The wiring area of the pixel regions can thereby be reduced as much as the area of the wiring for supplying the power supply voltage Vdd.

(Description of Function of Photoelectric Conversion Unit and Electronic Shutter Operation)

Next, an operation of the pixel 100 according to the present exemplary embodiment, and functions of the first blocking layer 104, the photoelectric conversion layer 103, and the second blocking layer 102 will be described in detail.

Figure 6:
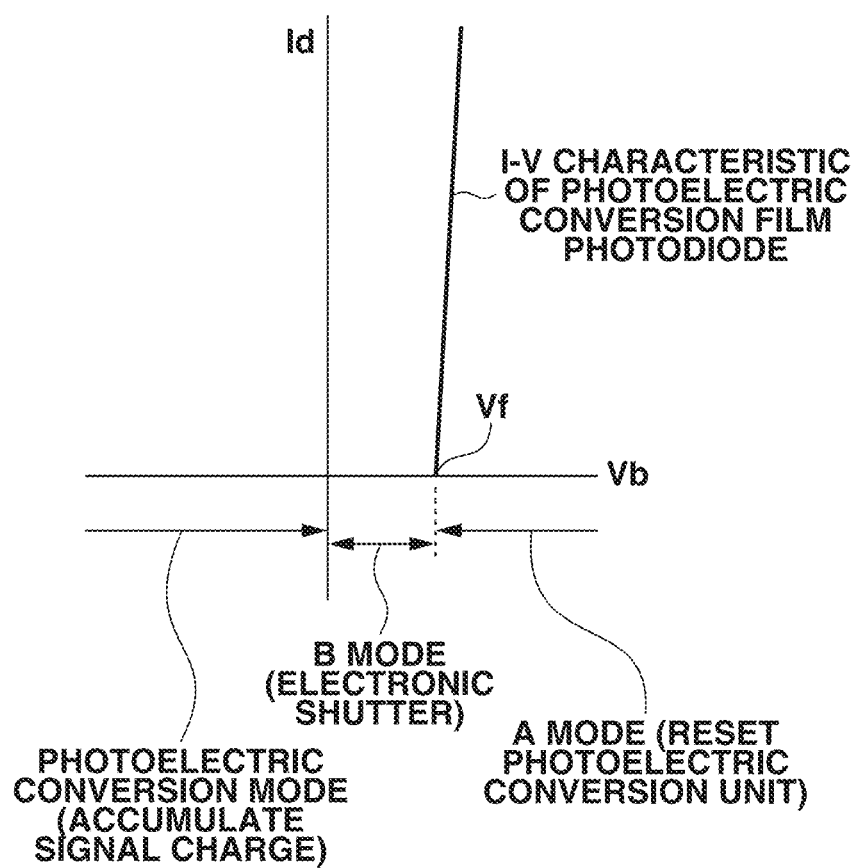
FIG. 6 is a diagram illustrating an operation of a photoelectric conversion unit according to a bias applied to the photoelectric conversion unit and one or more aspects of the present disclosure.

FIG. 6 illustrates a current-voltage (I-V) characteristic in a state where no light is incident on the photoelectric conversion unit 120 (referred to as dark time). In FIG. 6, the vertical axis indicates a current Id flowing between the upper electrode 101 and the pixel electrode 105. The horizontal axis indicates a voltage Vb applied to the photoelectric conversion unit 120. The voltage Vb is a voltage difference between the upper electrode 101 and the pixel electrode 105. A voltage Vf is a forward turn-on voltage of the photodiode.

If the photoelectric conversion unit 120 performs photoelectric conversion (photoelectric conversion mode), a relationship in magnitude between the voltage of the upper electrode 101 and that of the pixel electrode 105 is such that a reverse bias is applied to the photoelectric conversion layer 103. If light is incident on the photoelectric conversion layer 103, electrons and holes occur in the photoelectric conversion layer 103. Under the bias condition in the photoelectric conversion mode, the holes occurring in the photoelectric conversion layer 103 move to the pixel electrode 105, and the electrons move to the upper electrode 101. The pixel electrode 105 accumulates the holes occurring from the photoelectric conversion layer 103.

In an A mode in which a forward bias is applied to the photoelectric conversion layer 103 and the voltage Vb is in the range higher than the turn-on voltage Vf, electrons are injected from the upper electrode 101 into the photoelectric conversion layer 103.

In a B mode in which a forward bias is applied to the photoelectric conversion layer 103 and the voltage Vb is in the range lower than the turn-on voltage Vf, the photoelectric conversion unit 120 is in a state of performing an electronic shutter operation to be described below.

Figure 7A:
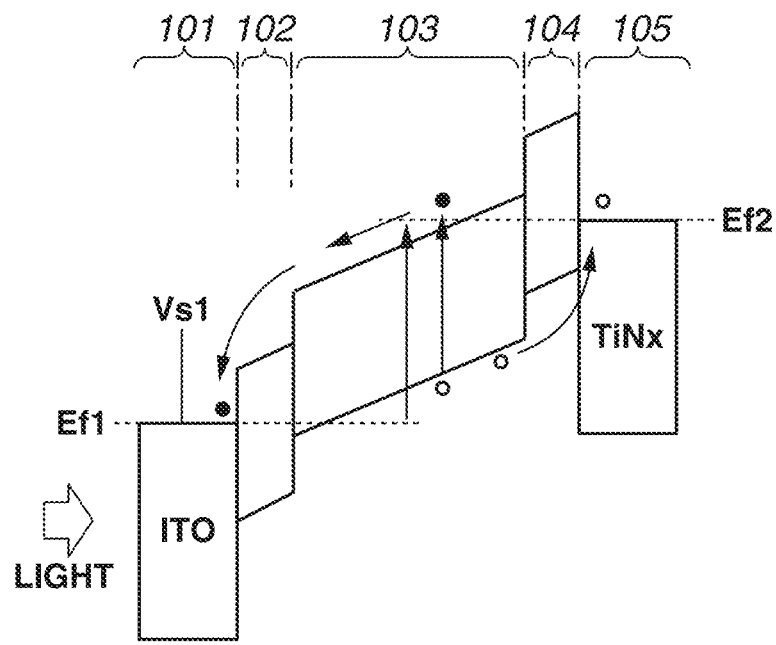
FIGS. 7A and 7B are diagrams illustrating an energy band state according to the operation of the photoelectric conversion unit and one or more aspects of the present disclosure.
Figure 7B:
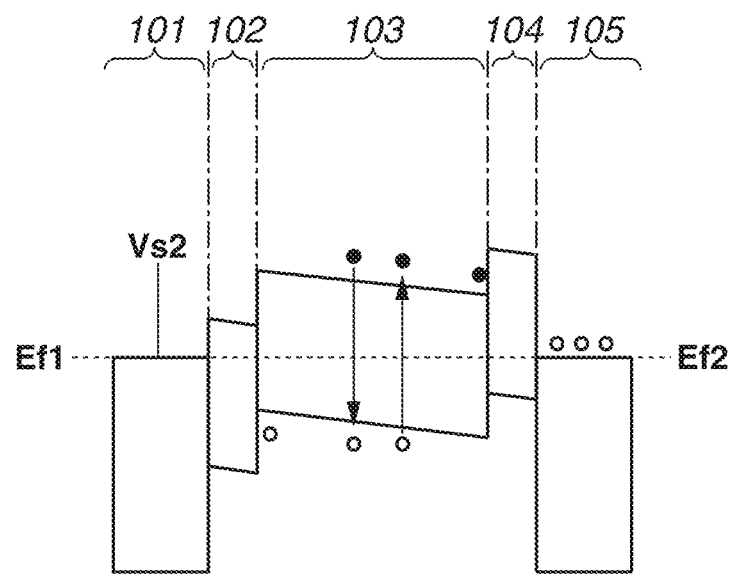

FIGS. 7A and 7B schematically illustrate bias conditions of the voltage applied to the photoelectric conversion unit 120 and an energy band structure of the photoelectric conversion unit 120 under the bias conditions. FIG. 7A corresponds to the photoelectric conversion mode (mode in which the pixel electrode 105 accumulates a signal charge) in FIG. 6. FIG. 7B corresponds to the B mode (mode in which an electronic shutter operation is performed) in FIG. 6. The vertical axes of FIGS. 7A and 7B indicate potentials with respect to electrons and holes. The voltage increases toward the bottoms of FIGS. 7A and 7B.

FIGS. 7A and 7B each illustrate energy bands of the upper electrode 101, the second blocking layer 102, the photoelectric conversion layer 103, the first blocking layer 104, and the pixel electrode 105. For example, FIG. 7A illustrates a case in which the upper electrode 101 is made of ITO and the pixel electrode 105 is made of TiNx. In the energy band diagrams illustrated in other drawings, the upper electrode 101 and the pixel electrode 105 are made of the same materials as in FIG. 7A unless otherwise specified.

A voltage Ef1 illustrated in FIGS. 7A and 7B is the Fermi level of the upper electrode 101. A voltage Ef2 is the Fermi level of the pixel electrode 105. For the second blocking layer 102, the photoelectric conversion layer 103, and the first blocking layer 104, a bandgap between the conduction and valence bands is illustrated.

FIG. 7A corresponds to the photoelectric conversion mode in FIG. 6. FIG. 7A illustrates potentials in a state in which holes serving as a signal charge among charges generated by the photoelectric conversion unit 120 by photoelectric conversion are accumulated in the pixel electrode 105. Electrons generated by the photoelectric conversion are illustrated by black circles. Holes are illustrated by white circles. The electrode driving voltage Vs supplied to the upper electrode 101 is set to a voltage Vs1 (for example, the same 3.3 V as the power supply voltage Vdd) which is a first voltage so that the photoelectric conversion unit 120 enters the photoelectric conversion mode. The photoelectric conversion layer 103 in the reverse bias state is depleted.

The holes among the charges generated by the photoelectric conversion layer 103 move to the pixel electrode 105. In the photoelectric conversion mode, the holes generated by the photoelectric conversion layer 103 are accumulated in the pixel electrode 105. The voltage of the node B rises according to the amount of signal charge accumulated in the pixel electrode 105. The rise in the voltage of the node B changes the band structure of the photoelectric conversion layer 103 toward a flat band state.

The photoelectric conversion unit 120 includes the second blocking layer 102. The injection of holes from the upper electrode 101 into the photoelectric conversion layer 103 is thereby suppressed. This can suppress the occurrence of a dark current which is caused by the injection of holes from the upper electrode 101 into the photoelectric conversion layer 103. In other words, the second blocking layer 102 is a second blocking portion that suppresses the injection of holes, which are a charge having the same polarity as that of the signal charge, from the upper electrode 101 into the photoelectric conversion layer 103.

The electrons occurring in the photoelectric conversion layer 103 move toward the upper electrode 101 and are thereby discharged from the photoelectric conversion unit 120.

The photoelectric conversion unit 120 includes the first blocking layer 104. The injection of electrons from the pixel electrode 105 into the photoelectric conversion layer 103 can be thereby suppressed. As a result, the occurrence of recombination of holes and electrons in the photoelectric conversion layer 103 can be suppressed. This suppresses a drop in sensitivity, which is caused by the injection of electrons from the pixel electrode 105 into the photoelectric conversion layer 103. In other words, the first blocking layer 104 is a blocking portion that allows the injection of holes, which are the signal charge, from the photoelectric conversion layer 103 into the pixel electrode 105 and suppresses the injection of electrons, which are a charge having a polarity opposite to that of the signal charge, from the photoelectric conversion layer 103 into the pixel electrode 105. The upper electrode 101 is the first electrode. The pixel electrode 105 is the second electrode.

FIG. 7B illustrates the potentials of the photoelectric conversion unit 120 corresponding to the B mode of FIG. 6. In the B mode illustrated in FIG. 6, the photoelectric conversion unit 120 implements an electronic shutter operation. All the pixels 100 illustrated in FIG. 1 simultaneously start photoelectric conversion and perform an operation for shifting from the photoelectric conversion mode to the B mode, whereby a global electronic shutter can be implemented. The electrode driving voltage Vs supplied to the upper electrode 101 is set to a voltage Vs2 (for example, 0 V) which is a second voltage so that the photoelectric conversion unit 120 enters the B mode. Since holes are used as the signal charge, the voltages Vs1 and Vs2 have a relationship of Vs2<Vs1.

In the B mode, the photoelectric conversion layer 103 is in a state similar to a flat band state. More specifically, few holes are injected from the upper electrode 101. Since the bias applied to the photoelectric conversion layer 103 is small, holes occurring from photoelectric conversion hardly move out of the photoelectric conversion layer 103. Electrons generated by the photoelectric conversion layer 103 hardly move out of the photoelectric conversion layer 103, either. The amounts of holes and electrons accumulated in the pixel electrode 105 therefore vary little. Such a state can be regarded to be one in which the holes accumulated in the pixel electrode 105 are retained. The pixel 100 according to the present exemplary embodiment ends the charge accumulation period of the photoelectric conversion unit 120 by shifting the photoelectric conversion unit 120 from the photoelectric conversion mode to the B mode.

(Description of Global Shutter Operation)

FIG. 8 illustrates a timing chart of driving signals in a global shutter operation used in the photoelectric conversion device according to the present exemplary embodiment. For the sake of simplicity, FIG. 8 illustrates the driving signals corresponding to signal read operations of two rows including an nth row and an (n+1)th row.

Between time t1 and time t2, the voltage Vs1 (for example, 3.3 V) is supplied as the common electrode driving voltage Vs to the first electrodes 101 of all the rows so that the photoelectric conversion units 120 enter the photoelectric conversion mode illustrated in FIG. 7A. In the meantime, all the pixels 100 simultaneously perform photoelectric conversion, whereby light signal charges (holes) are accumulated in the pixel electrodes 105 (simultaneous exposure). At the same time, the reset voltage Vres(n) is set to a low level V2 (for example, 0 V). The potentials of the nodes B and the FD portions are lowered via the capacitive elements 109. By such an operation, the nodes B and the FD portions are set to a zero bias driving state, off the dynamic range of the pixel source follower circuits constituted by the amplification transistors 106 and the current sources 150.

At time t2, the voltage Vs2 (for example, 1.5 V) is supplied as the electrode driving voltage Vs to the upper electrodes 101 in all the rows so that the photoelectric conversion units 120 enter the B mode illustrated in FIG. 7B. In the meantime, the sensitivity of the photoelectric conversion units 120 of all the pixels 100 simultaneously changes to substantially zero. At the same time, the driving signal (row selection signal) pSEL(n) becomes a high level, and the selection transistors 107 of the pixels 100 in the nth row turn on. The amplification transistors 106 of the pixels 100 in the nth row thus output signals. The reset voltage Vres(n) becomes a high level Vs2 (for example, 1.5 V). Here, the potentials of the nodes B and the FD portions are raised via the capacitive elements 109. As will be described below, by such an operation, the nodes B and the FD portions in the zero bias driving state are set to a reading state within the dynamic range of the pixel source follower circuits constituted by the amplification transistors 106 and the current sources 150.

The driving signal pTS(n) becomes a high level at time t3, and becomes a low level at time t4. Signals (light signals) S including the light signals accumulated in the nodes B and threshold variations of the amplification transistors 106 are thereby held in the capacitors CTS of the column circuits 140.

At time t5, the reset signal pRES(n) becomes a high level. At time t6, the reset signal pRES(n) becomes a low level. Since the reset voltage Vres(n) is maintained at Vr2 in the meantime, the signal charges of the nodes B and the FD portions are reset and set to 1.5 V of the reset voltage Vres(n).

The driving signal pTN(n) then becomes a high level at time t7, and becomes a low level at time t8. Signals (noise signals) N including threshold variations of the amplification transistors 106 are thereby held in the capacitors CTN of the column circuits 140.

At time t9, the row selection signal pSEL(n) becomes a low level, and the reading of the signals from the pixels 100 of the nth row into the column circuits 140 ends.

The noise signals N and the light signals S read into the column circuits 140 are output to the output amplifier unit 203 column by column based on the driving signal CSEL. The output amplifier unit 203 outputs differences between the signals S and the signals N to the AD conversion unit (ADC) 204.

At time t10, the row selection signal pSEL(n+1) becomes a high level. The selection transistors 107 of the pixels 100 in the (n+1)th row turn on. The reading of the signals from the pixels 100 in the (n+1)th row is then performed. Since the operation is similar to that of times t1 to t9, a description thereof will be omitted.

During the signal reading of each row, Vs2 (1.5 V) is applied as the electrode driving voltage Vs to the upper electrodes 101 of all the rows. In other words, all the pixels 100 are set to the B mode.

After the signals are similarly read up to the last row, the reset voltages Vres of all the rows are simultaneously set to Vr2 (1.5 V) at not-illustrated timing. The reset signals pRES become a high level, and after a predetermined time, become a low level. The nodes B of all the pixels 100 are thereby reset to Vr2 (1.5 V) (simultaneous reset). During the reading period, the reset voltage Vres(n) may be maintained at Vr2 (1.5 V).

Returning to the timing of time t1, Vs1 (3.3 V) is applied as the electrode driving voltage Vs to the upper electrodes 101 in all the rows so that the photoelectric conversion units 120 enter the photoelectric conversion mode illustrated in FIG. 7A. While the voltage Vs1 is applied to the upper electrodes 101, all the pixels 100 are simultaneously set to the photoelectric conversion mode (simultaneous exposure). At the same time, the reset voltage Vres(n) becomes a low level V2 (for example, 0 V). Here, the potentials of the nodes B and the FD portions are lowered via the capacitive elements 109. By such an operation, the nodes B and the FD portions are set to the zero bias driving state, off the dynamic range of the pixel source follower circuits constituted by the amplification transistors 106 and the current sources 150. In such a manner, the next frame of signal accumulation is performed.

(Effect of Provision of First Blocking Layer 104)

An effect of the present exemplary embodiment will be described with reference to FIGS. 9A to 9E. FIGS. 9B and 9C illustrate a reference example in which the photoelectric conversion unit 120 does not include the first blocking layer 104. FIGS. 9D and 9E illustrate an example, in which the photoelectric conversion unit 120 includes the first blocking layer 104, that has been described above. In the following description, electrons are used as a signal charge (electron accumulation type). The same effect is obtained when holes are used as a signal charge.

FIG. 9A illustrates an image incident on the photoelectric conversion device. The light signal of the pixel 100 at a position P1 (hereinafter, referred to as a pixel P1) has a level close to a dark level. The light signal of the pixel 100 at a position P2 (hereinafter, referred to as a pixel P2) has a level close to a saturation level. Depending on an imaging scene, a single image thus includes both a pixel P1 close to the dark level and a pixel P2 close to the saturation level.

FIGS. 9B and 9C illustrating the reference example will be described. FIG. 9B illustrates band structures of the photoelectric conversion unit 120 of the pixel P1. FIG. 9C illustrates band structures of the photoelectric conversion unit 120 of the pixel P2. The solid lines illustrated in FIGS. 9B and 9C represent the band structures in the photoelectric conversion mode. The dotted lines illustrated in FIGS. 9B and 9C represent the band structures in the B mode.

If the photoelectric conversion unit 120 of the pixel P1 in FIG. 9B is in the photoelectric conversion mode, as illustrated by the solid lines, few electrons resulting from the light signal are accumulated in the pixel electrode 105. The band structure of the photoelectric conversion unit 120 of the pixel P1 in the photoelectric conversion mode therefore remains to have a potential close to that in the reverse bias state when the photoelectric conversion unit 120 is reset.

If the photoelectric conversion unit 120 of the pixel P2 in FIG. 9C is in the photoelectric conversion mode, as illustrated by the solid lines, electrons resulting from the light signal are accumulated in the pixel electrode 105 and the voltage of the node B is lowered. The band structure of the photoelectric conversion unit 120 of the pixel P2 in the photoelectric conversion mode is thus close to that in the flat band state.

Suppose that the voltage Vs2 is set so that the pixel P1 which outputs a light signal close to the dark level has a flat band in the B mode. As illustrated by the dotted lines in FIG. 9B, the photoelectric conversion unit 120 of the pixel P1 in the B mode is in a state close to the flat band state.

If the photoelectric conversion unit 120 of the pixel P2 in FIG. 9C is in the B mode, as illustrated by the dotted lines, the voltage of the upper electrode 101 becomes relatively higher than that of the pixel electrode 105. While the photoelectric conversion unit 120 is in the B mode, holes occurring in the photoelectric conversion layer 103 are therefore more likely to move to the pixel electrode 105.

Since the holes occurring in the photoelectric conversion layer 103 move to the pixel electrode 105, electrons accumulated in the pixel electrode 105 disappear. The light signal of the pixel P2 thus has a signal level lower than that which originally is supposed to be output. As a result, the high luminance portion of the image generated by using the signal output by the photoelectric conversion device drops in luminance. In other words, the generated image has low contrast, compared to an image that is assumed to be generated without the disappearance of electrons accumulated in the pixel electrode 105.

The photoelectric conversion unit 120 according to the present exemplary embodiment includes the first blocking layer 104.

FIG. 9D illustrates the band structures of a pixel P1 that includes the photoelectric conversion unit 120 according to the present exemplary embodiment. In FIG. 9D, like FIG. 9B, the photoelectric conversion unit 120 of the pixel P1 in the B mode is in a state close to the flat band state.

In FIG. 9E, the band structure when the photoelectric conversion unit 120 of the pixel P2 is in the B mode is illustrated by the dotted lines. The movement of holes occurring in the photoelectric conversion layer 103 from the photoelectric conversion layer 103 to the pixel electrode 105 is suppressed by the first blocking layer 104.

Since the photoelectric conversion unit 120 includes the first blocking layer 104, the movement of the holes occurring in the photoelectric conversion layer 103 to the pixel electrode 105 is suppressed. The disappearance of electrons accumulated in the pixel electrode 105, which occurs in FIG. 9C, is thus also suppressed. The drop in the signal level of the light signal, which occurs in FIG. 9C, is thus also suppressed. As a result, the drop in the luminance of the high luminance portion of the image generated by using the signal output from the photoelectric conversion device, which occurs in FIG. 9C, is also suppressed. The photoelectric conversion device according to the present exemplary embodiment thus has an effect that a drop in image contrast, which has been caused by a conventional electronic shutter operation, can be suppressed.

In the present exemplary embodiment, in FIGS. 7A and 7B, holes are described to be a signal charge. A similar effect is obtained if electrons are used as a signal charge.

(Description of Capacitive Element 109 and Voltage Control Unit 110)

A function of the capacitive element 109 and the voltage control unit 110 according to the present exemplary embodiment will be described in detail below with reference to the drawings.

Figure 10:
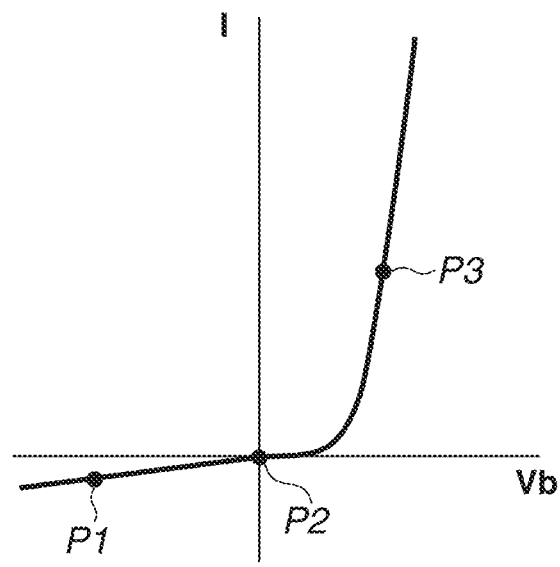
FIG. 10 is a diagram illustrating a relationship between a voltage and a current of a floating diffusion (FD) portion according to one or more aspects of the present disclosure.

FIG. 10 is a schematic diagram illustrating an I-V characteristic, during dark time, of the FD portion to which the pixel electrode 105 is connected. An impurity diffusion portion, such as the FD portion, and the semiconductor substrate 200 can form a diode. FIG. 10 is a diagram in which the vertical axis indicates a current flowing through the diode and the horizontal axis indicates a bias voltage Vb applied to the diode in such a case.

In FIG. 10, a point P1 represents a reverse bias state. A point P2 represents a zero bias state. A point P3 represents a forward bias state. In general, the impurity diffusion portion is set to the reverse bias state of the point P1 so that the impurity diffusion portion is electrically isolated from the semiconductor substrate 200. However, a defect is likely to occur between the impurity diffusion portion and the semiconductor substrate 200, and a leak current flows via the defect. Since the leak current depends on the reverse bias voltage applied between the impurity diffusion portion and the semiconductor substrate 200, the leak current increases as the reverse bias voltage increases. In FIG. 10, the current I is illustrated to include a component resulting from the leak current. The leak current forms a dark current during photoelectric conversion (during signal accumulation) and undesirably deteriorates a signal-to-noise (S/N) ratio.

The leak current occurs in a period immediately after the voltage of the impurity diffusion portion is reset. Such a period is the period during which the pixel electrode 105 accumulates a signal charge. To suppress the effect of the leak current, the bias voltage Vb between the impurity diffusion portion and the semiconductor substrate 200 can be set to the point P2, i.e., 0 V. More specifically, the first voltage supplied to the FD portion which is an impurity diffusion portion is set to be substantially the same as a predetermined voltage supplied to the semiconductor region in contact with the FD portion. This is referred to as zero bias resetting or zero bias driving.

Figure 11:
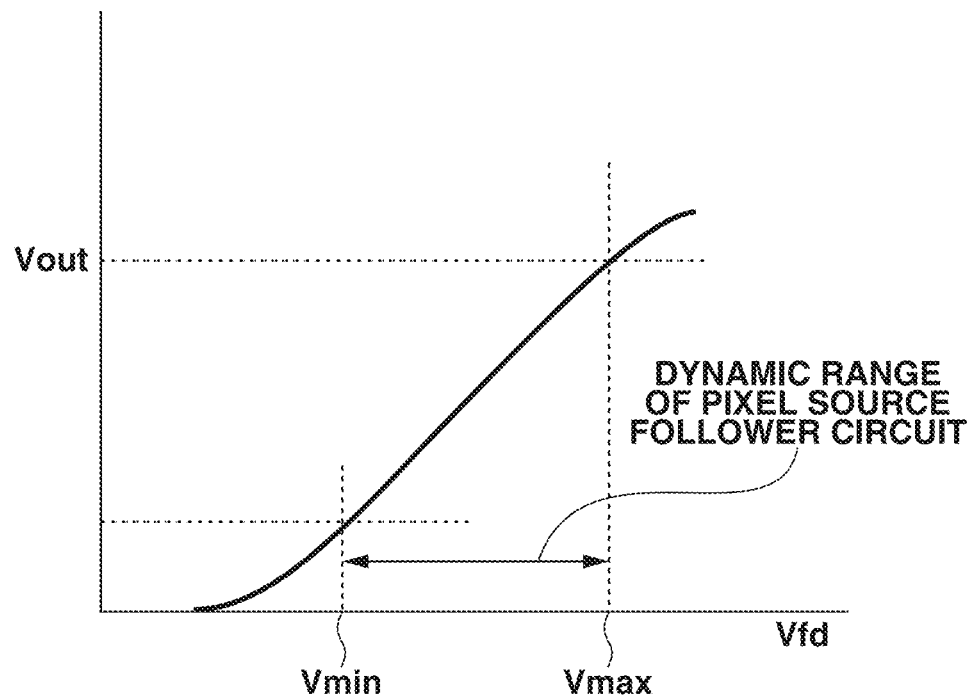
FIG. 11 is a diagram illustrating a relationship between an operation of a pixel source follower circuit and the voltage of the FD portion according to one or more aspects of the present disclosure.

FIG. 11 is a schematic diagram illustrating a relationship between an input voltage (voltage of the FD portion) Vfd and an output voltage Vout of the pixel source follower circuit constituted by the amplification transistor 106 and the current source 150. A dynamic range in which the linearity of the pixel source follower circuit is ensured has a minimum value Vmin and a maximum value Vmax. The voltage of the P type semiconductor substrate 200 is set at the ground (GND) (0 V). Suppose that the minimum value Vmin is 1.5 V, and the maximum value Vmax is 2.5 V.

In the present exemplary embodiment, holes are used as a signal charge. To ensure the linearity of the pixel source follower circuit, the reset voltage of the pixel electrode 105 and the FD portion is set at a value higher than or equal to the minimum value Vmin. The pixel electrode 105 and the FD portion are then reset by a reset voltage of 1.5 V. Holes collected to the pixel electrode 105 are accumulated in the FD portion. The voltage of the FD portion thus increases with a lapse of time.

The FD portion includes an N type impurity diffusion portion. The impurity diffusion portion also serves as a contact portion with the pixel electrode 105. The impurity diffusion portion of the FD portion is thus expressed as an N+ type semiconductor region.

The voltage of the N+ type impurity diffusion portion after the end of the resetting of the pixel electrode 105 and the FD portion is 1.5 V. The voltage of the P type semiconductor substrate 200 is 0 V. The resulting reverse bias state of 1.5 V generates a high leak current.

Now, if the reset voltage is set close to 0 V by zero bias resetting, the N+ type impurity diffusion portion has a voltage close to 0 V in value after the end of the resetting of the pixel electrode 105 and the FD portion. The resulting voltage thus falls below the minimum value Vmin which is the lower limit of the dynamic range of the pixel source follower circuit illustrated in FIG. 11. This precludes precise reading of the signal from the pixel source follower circuit.

In the present exemplary embodiment, the reset voltage is set to a value within the dynamic range of the pixel source follower circuit (in the present exemplary embodiment, 1.5 V). During signal accumulation, the voltage control unit 110 changes the voltage supplied to the capacitive element 109, whereby the voltage of the pixel electrode 105 and the FD portion is lowered. The voltage Vb illustrated in FIG. 10 is thereby shifted to near 0 V. During a period in which the pixel source follower circuit outputs a signal, the voltage of the pixel electrode 105 and the FD portion is raised. In such a manner, the voltage of the FD portion can be controlled within the dynamic range of the pixel source follower circuit. As a result, the pixel source follower circuit can output an accurate signal corresponding to the amount of holes accumulated in the FD portion.

As described above, in the present exemplary embodiment, the voltage of the second node 502 of the capacitive element 109 is changed between during resetting (1.5 V), during signal accumulation (0 V), and during reading (1.5 V). This enables the pixel source follower circuit to output an accurate signal while reducing the leak current occurring between the impurity diffusion portion and the semiconductor substrate 200.

The amount of control (lowering width and raising width) of the voltage of the node B by the capacitive element 109 and the voltage control unit 110 is determined with respect to an amount of change dVref in the voltage of the node C, depending on a ratio between the capacitance value Cp of the capacitive element 109 and a capacitance value C2 of a capacitance that the node B has. An amount of change dVB in the voltage of the node B is expressed as dVB=dVref×Cp/(Cp+C2). The capacitance value C2 of the capacitance of the node B includes the capacitance value of a capacitance that the photoelectric conversion unit 120 has and the capacitance value of other parasitic capacitances around the node B. In the present exemplary embodiment, the capacitance value of the capacitance of the photoelectric conversion unit 120 is dominant in the capacitance value C2 of the capacitance of the node B. The amount of change dVB in the voltage of the node B can be controlled by appropriately designing the capacitance value Cp of the capacitive element 109.

In the present exemplary embodiment, holes are described to be a signal charge, and the pixel transistors are described to be N-channel MOS (NMOS) transistors. In other example, a similar effect can be obtained with electrons as a signal charge and with the pixel transistors as P-channel MOS (PMOS) transistors.

A second exemplary embodiment will be described with emphasis on differences from the first exemplary embodiment.

The photoelectric conversion device according to the first exemplary embodiment performs a global shutter operation. The present exemplary embodiment differs from the first exemplary embodiment in performing a rolling shutter operation.

A photoelectric conversion device according to the present exemplary embodiment may have the same configuration as that of the first exemplary embodiment.

Figure 12:
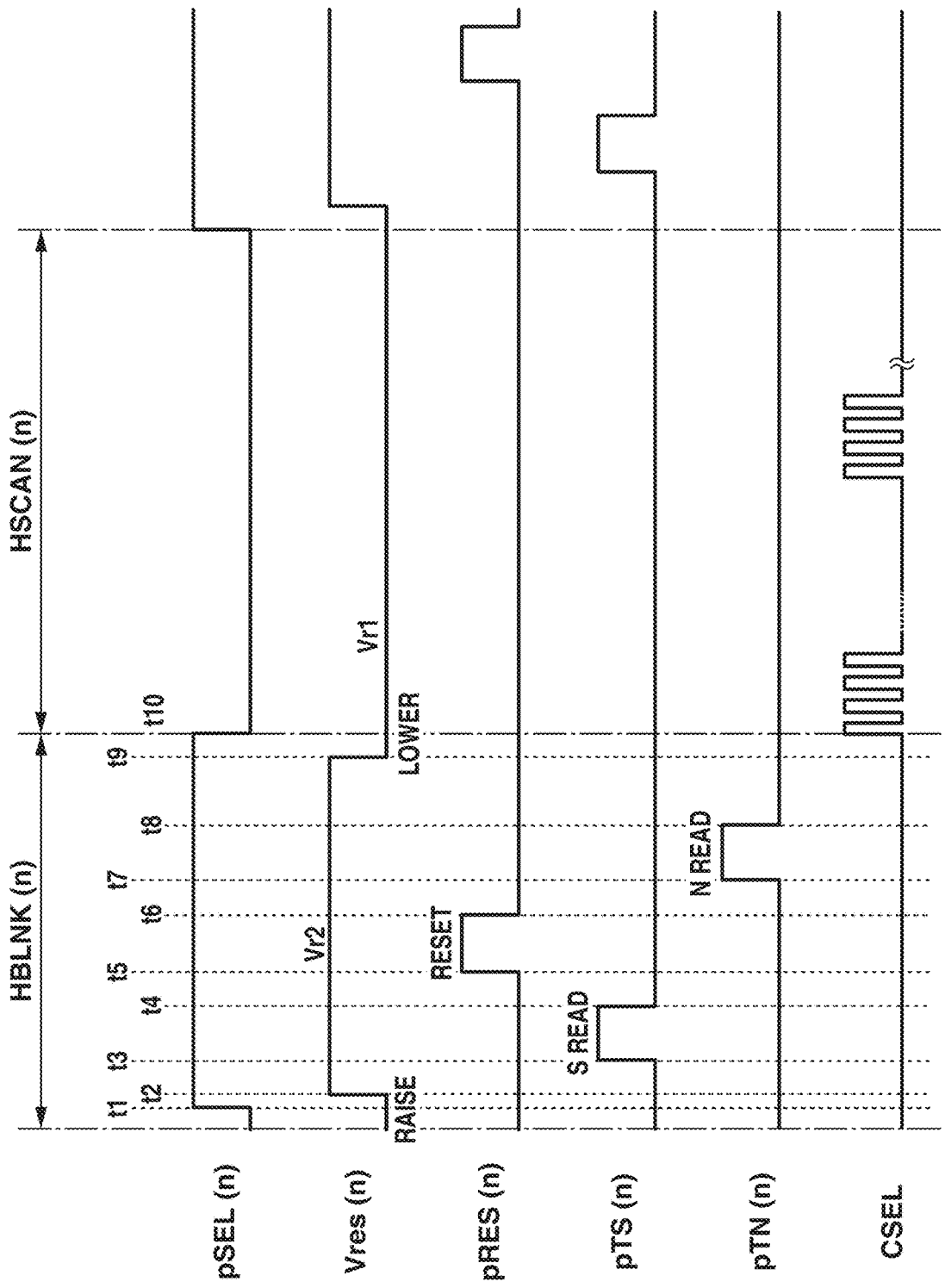
FIG. 12 is a diagram illustrating an operation of pixels according to one or more aspects of the present disclosure.
Figure 13:
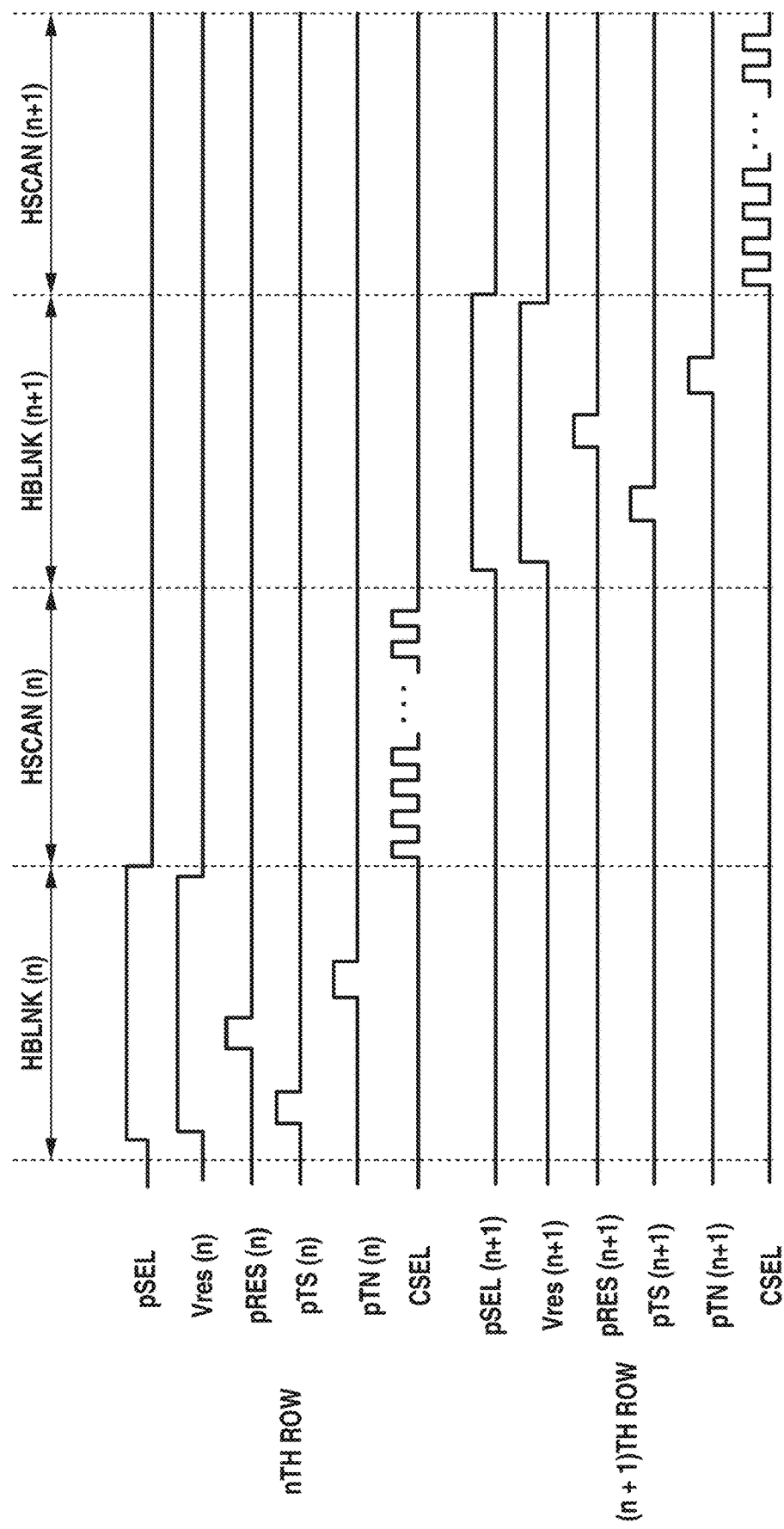
FIG. 13 is a diagram illustrating an operation of pixels according to one or more aspects of the present disclosure.

FIG. 12 is a timing chart illustrating an operation of the photoelectric conversion device according to the present exemplary embodiment. FIG. 12 illustrates driving signals corresponding to a read operation of the nth row. FIG. 13 illustrates driving signals corresponding to a read operation of the nth and (n+1)th, two rows of signals.

The row selection signal pSEL is supplied to the gates of the selection transistors 107. The reset voltage Vres is supplied to the drains of the reset transistors 108 and either one of the nodes of the respective capacitive elements 109.

The reset signal pRES is supplied to the gates of the reset transistors 108. The driving signal pTS is supplied to the S/H switches 303. The driving signal pTN is supplied to the S/H switches 305. The driving signal CSEL is supplied to the column circuits 140.

When the row selection signal pSEL, the reset signal pRES, the driving signal pTS, and the driving signal pTN are high levels, the corresponding transistors or switches turn on. When the row selection signal pSEL, the reset signal pRES, the driving signal pTS, and the driving signal pTN are low levels, the corresponding transistors or switches turn off. The electrode driving voltage Vs(n) not illustrated here is supplied to the nodes A of the photoelectric conversion units 120. In a rolling shutter operation, the electrode driving voltage Vs(n) is set to a fixed value (the same 3.3 V as the power supply voltage Vdd) so that the photoelectric conversion units 120 remain in the photoelectric conversion mode in a weak bias state.

In a period before time t1, the pixel electrodes 105 of the photoelectric conversion units 120 of the pixels 100 in the nth row and the photoelectric conversion units 120 of the pixels 100 in the (n+1)th row are in a state of accumulating signal charges. The reset voltage Vres(n) is set at a low level Vr1 (for example, 0 V). The FD portions are thereby reset with a zero bias, and then enter a zero bias driving state.

At time t1, the row selection signal pSEL(n) becomes a high level, and the selection transistors 107 of the pixels 100 in the nth row turn on. The amplification transistors 106 of the pixels 100 in the nth row thus output signals.

At time t2, the reset voltage Vres(n) becomes a high level Vr2 (for example, 1.5 V). Here, the voltages of the nodes B and the FD portions are raised via the capacitive elements 109. The nodes B and the FD portions in the zero bias driving state are thereby set to a reading state within the dynamic range of the pixel source follower circuits constituted by the amplification transistors 106 and the current sources 150.

The driving signal pTS(n) becomes a high level at time t3, and becomes a low level at time t4. In the meantime, the signals S including the light signals accumulated in the nodes B and threshold variations of the amplification transistors 106 are held in the capacitors CTS of the column circuits 140.

The reset signal pRES(n) becomes a high level at time t5, and becomes a low revel at time t6. In the meantime, the reset voltage Vres(n) is maintained at Vr2, or 1.5 V, and the signal charges in the nodes B and the FD portions are reset by using the voltage of 1.5 V. After the reset voltage Vres(n) is set at 1.5 V, the photoelectric conversion units 120 enter the photoelectric conversion mode. Since the electrode driving voltage Vs(n) is 3.3 V and the voltage of the pixel electrodes 105 is 1.5 V, the photoelectric conversion units 120 are in a reverse bias state.

The driving signal pTN(n) then becomes a high level at time t7, and becomes a low level at time t8. In the meantime, the signals N including threshold variations of the amplification transistors 106 are held in the capacitors CTN of the column circuits 140. If light is incident on the photoelectric conversion units 120 in the photoelectric conversion mode, signal charges are generated by the light. The interval between time t7 and t8 therefore can be narrow. In the present exemplary embodiment, the electrode driving voltage Vs(n) is fixed. In another example, the electrode driving voltage Vs(n) is set at Vs2 to bring the photoelectric conversion films into a dead state during a signal read period HBLNK(n). The capacitors CTN of the column circuits 140 may hold the signals N in such a dead state period.

Then, the pixels 100 in the nth row start to accumulate signal charges of the next frame. FIG. 7A illustrates the state of the energy bands of the photoelectric conversion units 120 during the accumulation of the signal charges.

At time t9, the reset voltage Vres(n) becomes a low level V2 (for example, 0 V). Here, the voltage of the nodes B and the FD portions is lowered via the capacitive elements 109. By such an operation, the nodes B and the FD portions are set to the zero bias driving state. Similar to the first exemplary embodiment, the photoelectric conversion device according to the present exemplary embodiment can thus perform signal accumulation in such a state that dark currents occurring between the impurity regions of the FD portions and the semiconductor substrate 200 are suppressed.

At time t10, the row selection signal pSEL(n) becomes a low level. The reading of the signals from the pixels 100 in the nth row to the column circuits 140 ends.

The noise signals N and the light signals S read by the column circuits 140 are output to the output amplifier unit 203 column by column based on the driving signal CSEL. The output amplifier unit 203 outputs differences between the signals S and the signals N to the AD conversion unit 204.

As illustrated in FIG. 13, the reading of the signals from the pixels 100 in the (n+1)th row is then performed. Since the operation is similar to that of times t1 to t8, a description thereof will be omitted.

According to the present exemplary embodiment, similar to the first exemplary embodiment, low-noise signal reading can be performed with a reduced circuit area.

A photoelectric conversion device according to a third exemplary embodiment will be described with emphasis on differences from the second exemplary embodiment.

The pixels 100 of the photoelectric conversion device according to the second exemplary embodiment, having the same pixel configuration as that of the first exemplary embodiment, include the selection transistors 107. In the present exemplary embodiment, pixels 100 are configured so that no selection transistor 107 is included. In the present exemplary embodiment, the selection and deselection of pixel rows, which is performed by the selection transistors 107 of the pixels 100 in the second exemplary embodiment, is performed by a voltage control unit 110 changing its output voltages supplied to FD portions.

Figure 14:
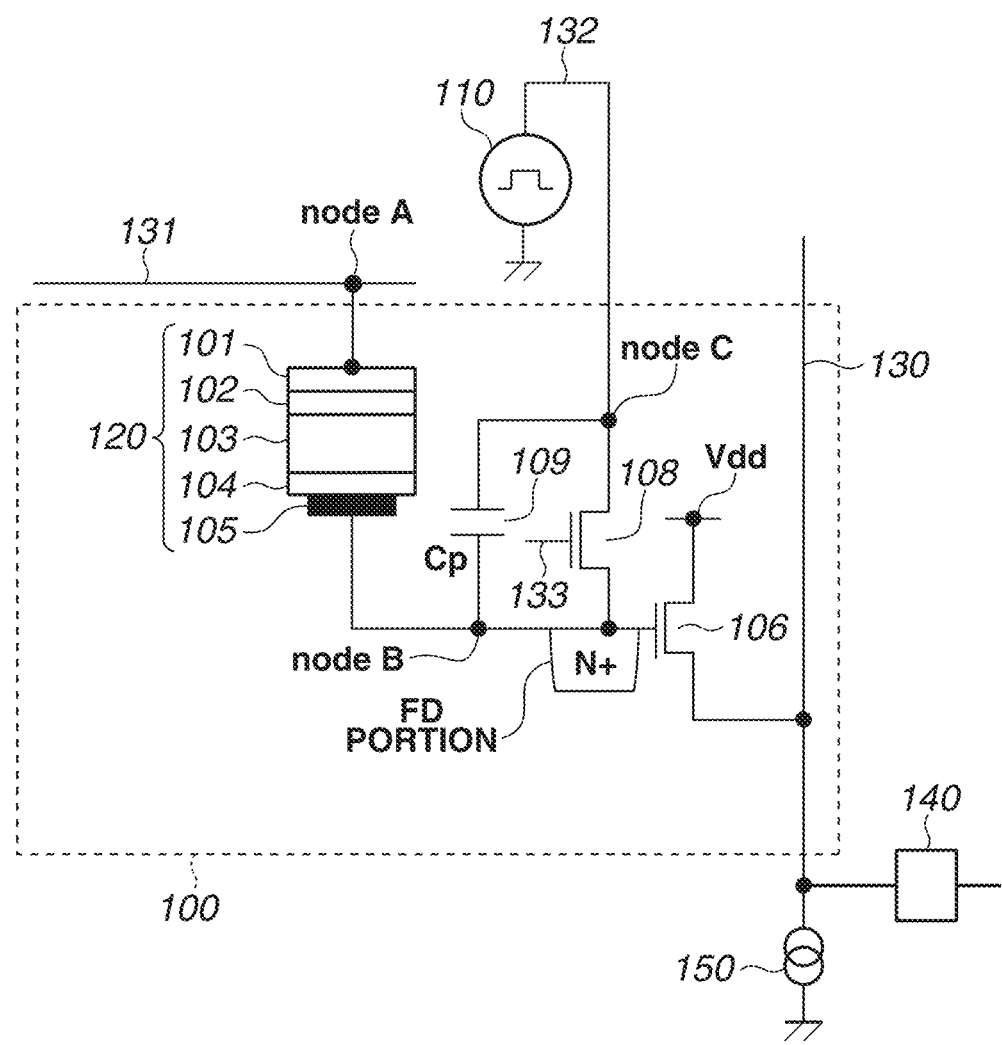
FIG. 14 is a diagram illustrating a configuration of a pixel according to one or more aspects of the present disclosure.

FIG. 14 is a circuit diagram of the pixels 100 included in the photoelectric conversion device according to the present exemplary embodiment. As described above, the pixels 100 according to the present exemplary embodiment are configured so that no selection transistor 107 is included. In other respects, the configuration is the same as that of the pixels 100 according to the second exemplary embodiment.

The present exemplary embodiment is characterized in that the voltage control unit 110 performs row selection by controlling the voltage of the FD portions (FD voltage) via the reset transistors 108. As compared to the first exemplary embodiment, the selection transistors 107 can thus be omitted. The circuit area of the pixels 100 can be thereby reduced. Since the driving signal lines can be omitted, the wiring area of the pixel regions can also be reduced.

Figure 15:
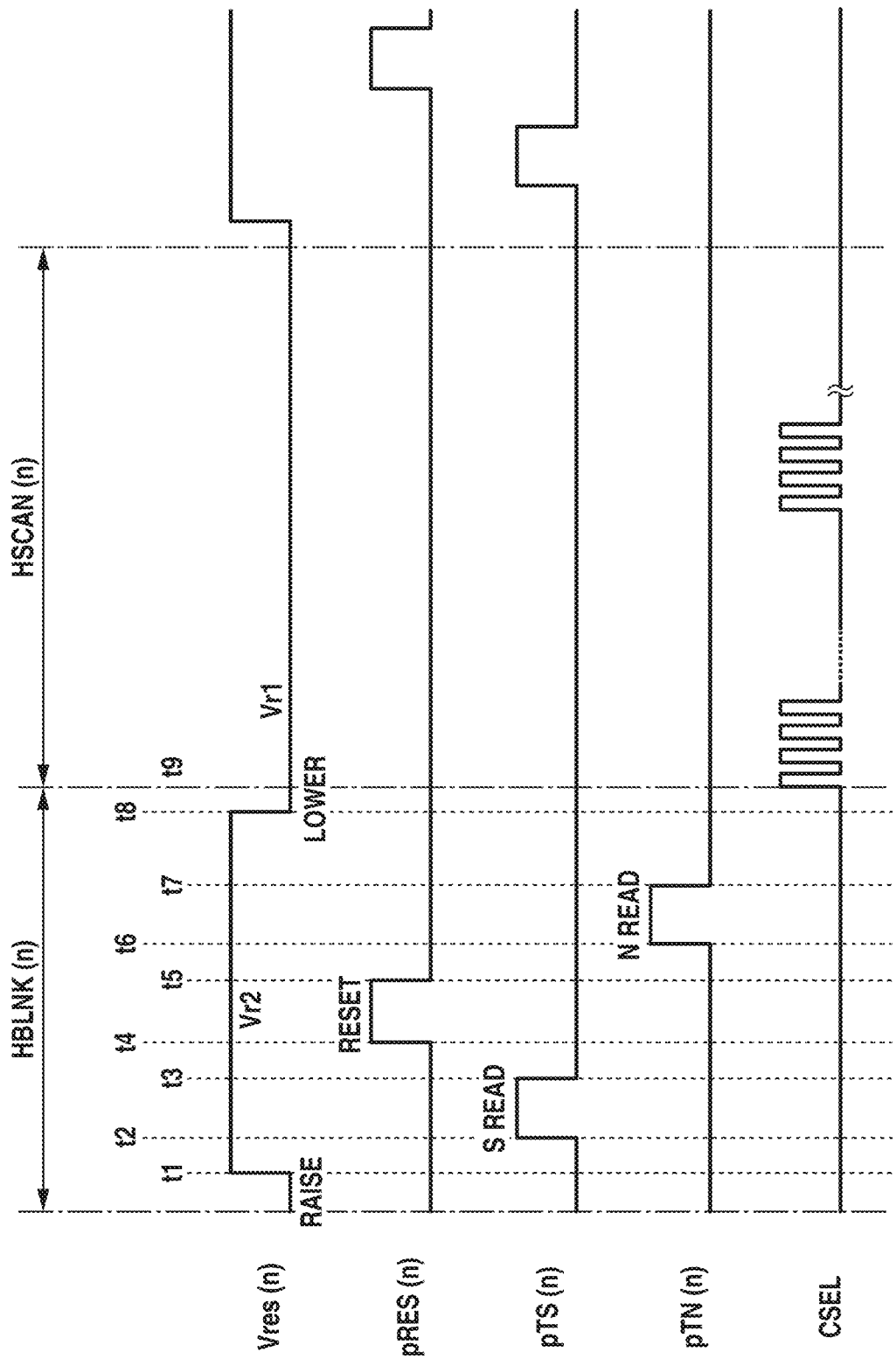
FIG. 15 is a diagram illustrating an operation of pixels according to one or more aspects of the present disclosure.

FIG. 15 illustrates a timing chart of the driving signals in a rolling shutter operation used for the photoelectric conversion device according to the present exemplary embodiment. Differences from the second exemplary embodiment will be mainly described below.

At time t1, the reset voltage Vres(n) becomes a high level Vr2 (for example, 1.5 V). Here, the voltage of the nodes B and the FD portions is raised via the capacitive elements 109. As described in FIG. 11, by such an operation, the nodes B and the FD portions in the zero bias driving state are set to the reading state within the dynamic range of the pixel source follower circuits constituted by the amplification transistors 106 and the current sources 150. Here, the pixel source follower circuits in the nth row enter an operating state. The pixel source follower circuits in the other rows are in a non-operating state. In other words, a selection operation for selecting the nth row is performed by setting the reset voltage Vres(n) to the high level Vr2.

The driving signal pTS(n) becomes a high level at time t2, and becomes a low level at time t3. In the meantime, the signals S including the light signals accumulated in the nodes B and threshold variations of the amplification transistors 106 are held in the capacitors CTS of the column circuits 140.

The reset signal pRES(n) becomes a high level at time t4, and becomes a low level at time t5. Since the reset voltage Vres(n) is maintained at Vr2 in the meantime, the signal charges in the nodes B and the FD portions are reset. The photoelectric conversion units 120 enter the photoelectric conversion mode after the reset voltage Vres(n) is set to 1.5 V. Since the electrode driving voltage Vs(n) is 3.3 V and the voltage of the pixel electrodes 105 is 1.5 V, the photoelectric conversion units 120 are in the reverse bias state.

The driving signal pTN(n) then becomes a high level at time t6, and becomes a low level at time t7. In the meantime, the signals N including threshold variations of the amplification transistors 106 are held in the capacitors CTN of the column circuits 140.

At time t8, the reset voltage Vres(n) becomes a low level Vr1 (for example, 0 V). Here, the voltage of the nodes B and the FD portions is lowered via the capacitive elements 109. By such an operation, the nodes B and the FD portions are set to the zero bias driving state. The nodes B and the FD portions thus go off the dynamic range of the pixel source follower circuits constituted by the amplification transistors 106 and the current sources 150. This brings the pixel source follower circuits in the nth row into a non-operating state, whereby a deselection operation can be implemented.

The voltage control unit 110 performs an operation for switching the reset voltage Vres(n) between Vr1 and Vr2. The function of the selection transistors 107 can be substituted by such an operation. The selection transistors 107 and the driving signal lines can therefore be omitted. As described above, the circuit area of the pixels 100 and the wiring area of the pixel regions can be thereby reduced, compared to those of the photoelectric conversion device according to the second exemplary embodiment.

A photoelectric conversion device according to a fourth exemplary embodiment will be described with emphasis on differences from the first exemplary embodiment.

Figure 16:
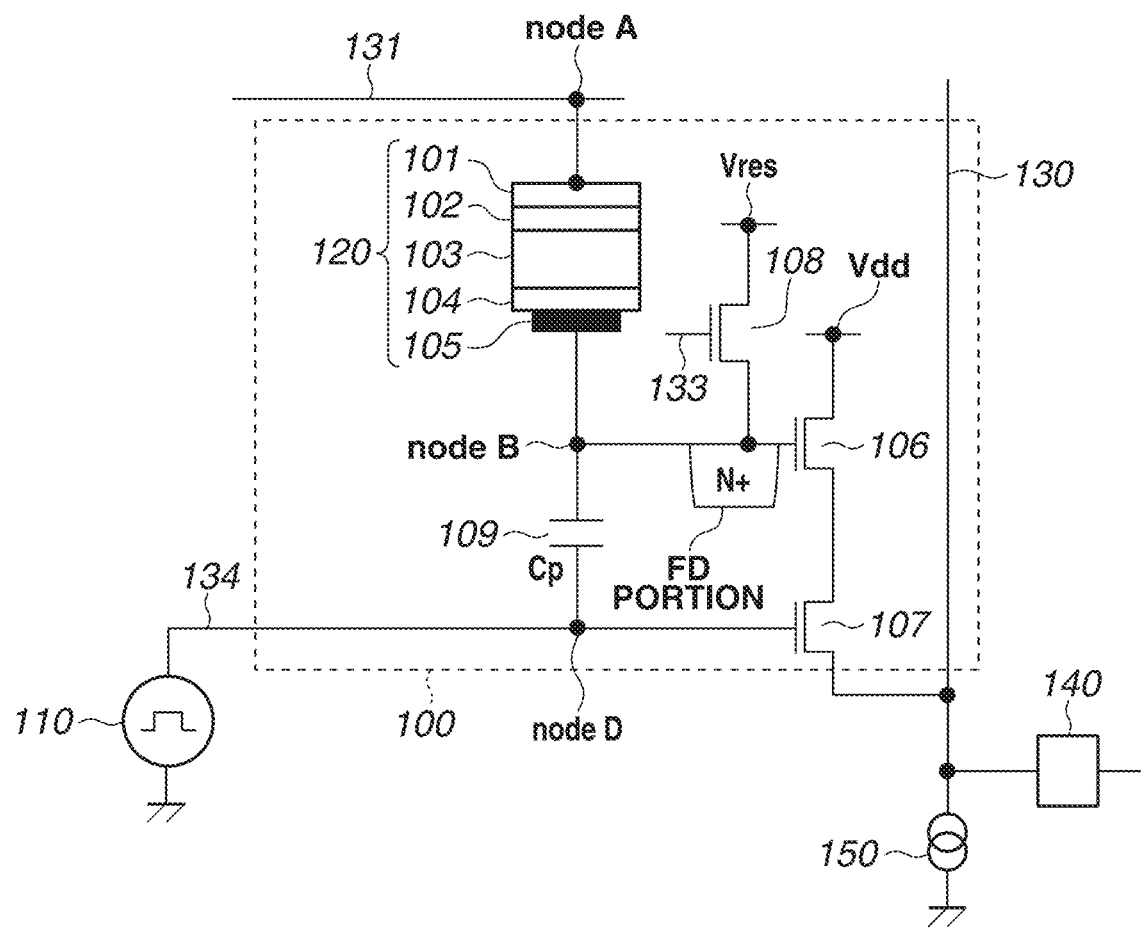
FIG. 16 is a diagram illustrating a configuration of a pixel according to one or more aspects of the present disclosure.

FIG. 16 illustrates a configuration of the photoelectric conversion unit 120 according to the fourth exemplary embodiment. Portions having similar functions to those of FIG. 3A are designated by the same reference numerals. A description of portions similar to those of the first exemplary embodiment will be omitted.

Features of the present exemplary embodiment will be described below with reference to the drawings.

The node B in FIG. 16 is connected to the gate electrode of the amplification transistor 106. The node B is connected to the source electrode of the reset transistor 108. The node B is connected to the first terminal of the capacitive element 109. The drain of the reset transistor 108 is connected to the reset voltage Vres. If the reset transistor 108 is turned on, the reset transistor 108 sets the voltage of the FD portion to the reset voltage Vres. In the present exemplary embodiment, the second node of the capacitive element 109 is connected to a node D. The node D is connected to the voltage control unit 110, and controls the voltage of the node B and the FD portion via the capacitive element 109. The node D is also connected to the gate of the selection transistor 107. The voltage control unit 110 thereby controls the selection transistor 107 on and off.

In the first exemplary embodiment, the wiring for supplying the reset voltage Vres to the reset transistor 108 and the wiring for supplying a voltage to the capacitive element 109 are made common. In the present exemplary embodiment, the wiring for controlling the voltage of the gate of the selectin transistor 107 and the wiring for supplying a voltage to the capacitive element 109 are made common.

Figure 17:
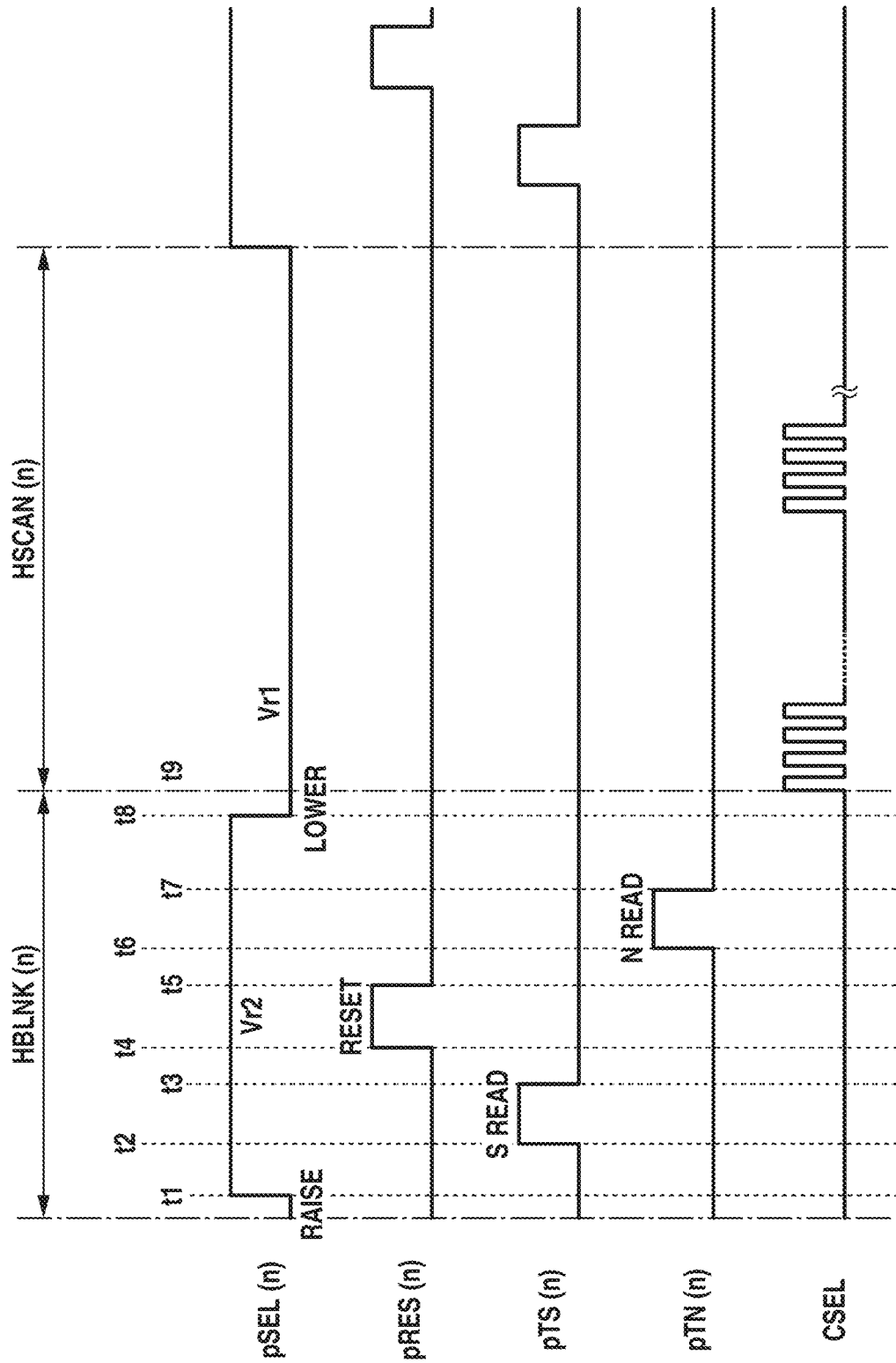
FIG. 17 is a diagram illustrating an operation of pixels according to one or more aspects of the present disclosure.

FIG. 17 illustrates a timing chart of the driving signals in a rolling shutter operation used for the photoelectric conversion device according to the present exemplary embodiment. Differences from the second exemplary embodiment will be mainly described.

At time t1, the control voltage (row selection signal) pSEL(n) becomes a high level Vr2 (for example, 1.5 V). The selection transistors 107 of the pixels 100 in the nth row turn on, and the nth row enters a selected state. The amplification transistors 106 of the pixels 100 in the nth row thus output signals. At the same time, the voltage of the nodes B and the FD portions is raised via the capacitive elements 109. As described in FIG. 11, by such an operation, the nodes B and the FD portions in the zero bias driving state are set to the reading state within the dynamic range of the pixel source follower circuits constituted by the amplification transistors 106 and the current sources 150. Here, the pixel source follower circuits in the nth row enter an operating state.

The reset signal pRES(n) becomes a high level at time t4, and becomes a low level at time t5. The FD portions are set to the reset voltage Vres(n), or 1.5 V.

The driving signal pTN(n) then becomes a high level at time t6, and becomes a low level at time t7. In the meantime, the signals N including threshold variations of the amplification transistors 106 are held in the capacitors CTN of the column circuits 140.

At time t8, the control voltage (row selection signal) pSEL(n) becomes a low level Vr1 (for example, 0 V). The selection transistors 107 turn off, and the nth row enters a deselected state. Here, the voltage of the nodes B and the FD portions is lowered via the capacitive elements 109. By such an operation, the nodes B and the FD portions are set to the zero bias driving state.

In the present exemplary embodiment, the gates of the selection transistors 107 and the second nodes of the capacitive elements 109 are connected to the same control line pSEL. The number of control lines can thus be reduced, compared to the case where the voltages are supplied to the gates of the selection transistors 107 and the second nodes of the capacitive elements 109 by using separate control lines. In the present exemplary embodiment, the selection transistors 107 and the second nodes of the capacitive elements 109 are connected the same voltage control unit 110. The circuit area of the voltage control unit 110 can thus be reduced, compared to the case where the selection transistors 107 and the second nodes of the capacitive elements 109 are controlled by separate voltage control units.

The photoelectric conversion device according to the present exemplary embodiment may be applied to a configuration including no selection transistor 107 like the third exemplary embodiment.

Figure 18:
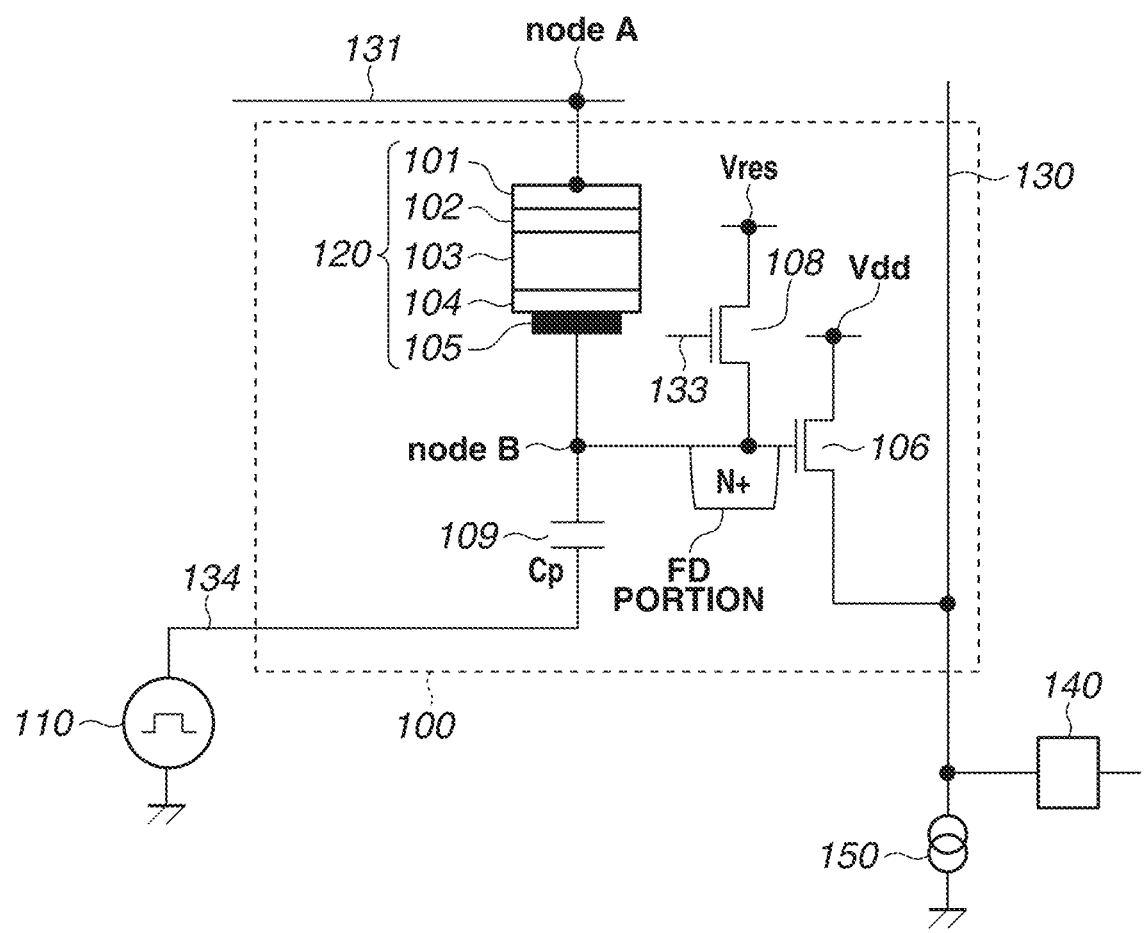
FIG. 18 is a diagram illustrating a configuration of a pixel according to one or more aspects of the present disclosure.

FIG. 18 is a circuit diagram illustrating a pixel 100 of such an example.

Since the function of the selection transistor 107 can be substituted by an operation for controlling the control voltage (row selection signal) pSEL(n) between Vr1 and Vr2, the selection transistor 107 and the driving signal line can be omitted. This allows a further reduction in pixel area.

A photoelectric conversion device according to a fifth exemplary embodiment will be described with emphasis on differences from the first exemplary embodiment.

A photoelectric conversion unit 120 of a pixel 100 included in the photoelectric conversion device according to the present exemplary embodiment is a metal-insulator-semiconductor (MIS) photoelectric conversion unit which includes an insulation layer sandwiched between a photoelectric conversion layer 103 and a pixel electrode 105.

Figure 19:
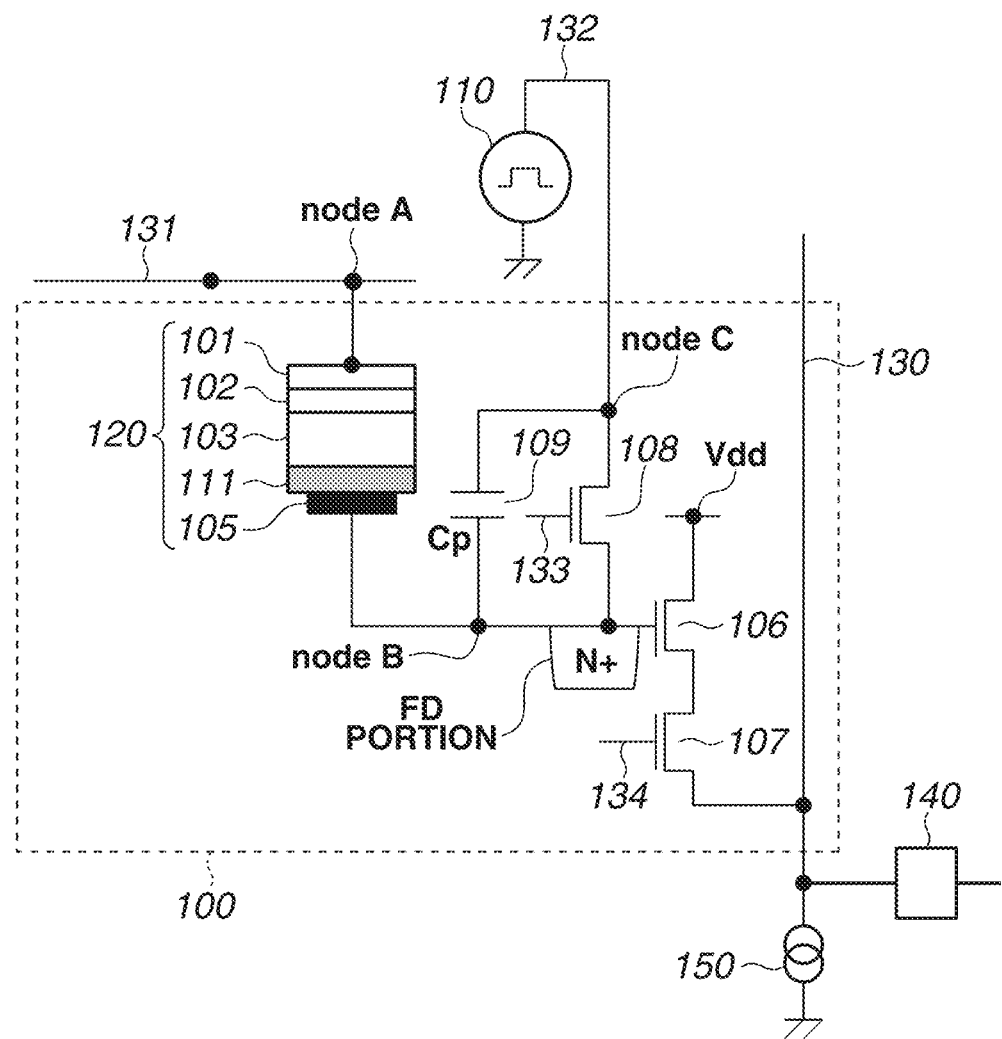
FIG. 19 is a diagram illustrating a configuration of a pixel according to one or more aspects of the present disclosure.

FIG. 19 illustrates a configuration of the photoelectric conversion unit 120 according to the present exemplary embodiment. Portions having similar functions to those of FIG. 3 are designated by the same reference numerals. A description of portions similar to those of the first exemplary embodiment will be omitted.

The photoelectric conversion unit 120 according to the present exemplary embodiment includes the upper electrode 101, a blocking layer 102, the photoelectric conversion layer 103, an insulation layer 111, and the pixel electrode 105. The photoelectric conversion unit 120 has an MIS configuration. A predetermined electrode driving voltage Vs is supplied to the upper electrode 101. Even in the present exemplary embodiment, holes generated by the photoelectric conversion layer 103 are used as a signal charge. For example, an electrode driving voltage Vs of 3 V is supplied to the upper electrode 101.

The gate of the amplification transistor 106 serves as an input node of an amplification unit. The gate of the amplification transistor 106 is electrically connected to the pixel electrode 105.

The pixel electrode 105 is electrically connected to the first node of the capacitive element 109. The second node of the capacitive element 109 is capacitively coupled to the first node. In other words, the node C is capacitively coupled to the node B via the capacitive element 109. In the present exemplary embodiment, the voltage control unit 110 is connected to the second node of the capacitive element 109. A voltage Vref is supplied from the voltage control unit 110 to the second node of the capacitive element 109 and the reset transistor 108 via the voltage control line (Vref line) 132. When the reset transistor 108 is off, the voltage control unit 110 supplies at least a first voltage Vref1 and a second voltage Vref2 having a value different from that of the first voltage Vref1 to the second node of the capacitive element 109. The voltage control unit 110 thereby performs an operation for lowering and raising the voltage of the node B.

If holes are used as a signal charge, the second voltage Vref2 is a voltage higher than the first voltage Vref1. If holes are used as a signal charge, for example, the first voltage Vref1 is 0 V and the second voltage Vref2 is 5 V. On the other hand, if electrons are used as a signal charge, the second voltage Vref2 is a voltage lower than the first voltage Vref1. If electrons are used as a signal charge, for example, the first voltage Vref1 is 5 V and the second voltage Vref2 is 0 V.

The drain of the reset transistor 108 is connected to the node C. The source of the reset transistor 108 is connected to the pixel electrode 105 and the gate of the amplification transistor 106. When the reset transistor 108 is on, the voltage control unit 110 supplies the reset voltage Vres to the node C. With such a configuration, the reset transistor 108 can reset the voltage of the node B to the reset voltage Vres. In the present exemplary embodiment, the voltage control unit 110 controls the three-value output including Vref1, Vref2, and Vres.

Next, the reset voltage Vres supplied by the reset transistor 108 will be described. If holes are used as a signal charge, the reset voltage Vres is a voltage lower than the electrode driving voltage Vs supplied to the upper electrode 101 of the photoelectric conversion unit 120. If electrons are used as a signal charge, the reset voltage Vres is a voltage higher than the electrode driving voltage Vs supplied to the upper electrode 101 of the photoelectric conversion unit 120.

In the present exemplary embodiment, the voltage of the node B coupled to the node C via the capacitive element 109 is controlled by controlling the voltage Vref of the node C. A relationship in magnitude, in terms of direct-current voltages, between the voltage Vref supplied to the node C and the reset voltage Vres or the electrode driving voltage Vs supplied to the node A is therefore not particularly limited.

Next, an operation of the photoelectric conversion device according to the present exemplary embodiment will be described. FIGS. 20A to 20F schematically illustrate energy bands of the photoelectric conversion unit 120. FIG. 21 illustrates a timing chart of driving signals used in the photoelectric conversion device according to the present exemplary embodiment.

FIGS. 20A to 20F illustrate the energy bands of the upper electrode 101, the blocking layer 102, the photoelectric conversion layer 103, the insulation layer 111, and the pixel electrode 105. The vertical axes of FIGS. 20A to 20F indicate a potential with respect to electrons and holes. The higher in FIGS. 20A to 20F, the higher the potential with respect to electrons. In other words, the higher in FIGS. 20A to 20F, the lower the voltage. For the upper electrode 101 and the pixel electrode 105, the energy level of free electrons is illustrated. For the blocking layer 102 and the photoelectric conversion layer 103, a band gap between the energy level of the conduction band and that of the valence band is illustrated. For the sake of convenience, the potential of the photoelectric conversion layer 103 at the interface between the photoelectric conversion layer 103 and the insulation layer 111 will be referred to as a surface potential of the photoelectric conversion layer 103, or simply a surface potential.

The photoelectric conversion unit 120 operates by repeating the following steps (1) to (6). In step (1), the input node of the amplification unit is reset. In step (2), a noise signal N is read (N read). In step (3), a signal charge is discharged from the photoelectric conversion unit 120 (charge discharging operation). In step (4), a light signal S is read (S read). In step (5), the photoelectric conversion unit 120 is reset before a start of accumulation of a signal charge. In step (6), the photoelectric conversion unit 120 accumulates a signal charge (accumulation operation). Each of the steps (1) to (6) will be described below.

FIG. 20A illustrates a state of the photoelectric conversion unit 120 in steps (1) and (2). The electrode driving voltage Vs is supplied to the upper electrode 101. For example, the electrode driving voltage Vs is 3 V. Holes represented by white circles are accumulated, as a signal charge occurring during an accumulation period, at the interface between the photoelectric conversion layer 103 and the insulation layer 111. The surface potential of the photoelectric conversion layer 103 changes to decrease (to higher voltages) according to the amount of accumulated holes. If electrons are accumulated as a signal charge at the interface, the surface potential changes to increase (to lower voltages) according to the amount of accumulated electrons. The first voltage Vref1 is supplied to the node C. For example, the first voltage Vref1 is 0 V. At time t1, the row selection signal pSEL(n) becomes a high level. The selection transistor 107 turns on, and the row to be read is selected.

At time t2, the reset signal pRES(n) becomes a high level, and the reset transistor 108 turns on. The voltage control unit 110 resets the voltage of the node including the pixel electrode 105, i.e., the node B to the reset voltage Vres. At the same time, the voltage of the gate of the amplification transistor 106 is reset. For example, the reset voltage Vres is 1.5 V.

Then, at time t3, the reset signal pRES(n) become a low level, and the reset transistor 108 turns off. Here, reset noise (noise kTC1 in FIG. 20A) occurs from the reset transistor 108. The node B is then maintained to be electrically floating.

The surface potential of the photoelectric conversion layer 103 changes according to a change in the voltage of the pixel electrode 105 due to the reset operation. Here, the voltage of the pixel electrode 105 changes in a direction opposite to the direction in which the voltage of the pixel electrode 105 changes due to the accumulation of the signal charge. The holes serving as a signal charge therefore remain to be accumulated in the photoelectric conversion layer 103. Since the injection of holes from the upper electrode 101 is suppressed by the blocking layer 102, the amount of signal charge accumulated in the photoelectric conversion layer 103 is less likely to change.

At time t4, the driving signal pTN(n) becomes a high level. The noise signal N (Vres+kTC1) including the reset noise output from the amplification transistor 106 is held in the capacitor CTN of the column circuit 140 (N read). At time t5, the driving signal pTN(n) becomes a low level, and the N read operation ends.

FIGS. 20B and 20C illustrate the state of the photoelectric conversion unit 120 in step (3). At time t6, the second voltage Vref2 is initially supplied to the node C. Since holes are used as a signal charge, the second voltage Vref2 is a voltage higher than the first voltage Vref1. For example, the second voltage Vref2 is 5 V.

Here, the voltage of the pixel electrode 105 (node B) changes in the same direction as that of the change in the voltage of the node C. The amount of change dVB in the voltage of the pixel electrode 105 is determined according to the capacitance value Cp of the capacitive element 109 connected to the pixel electrode 105 and the capacitance value C2 of the capacitance that the photoelectric conversion unit 120 has. The amount of change dVB in the voltage of the pixel electrode 105 with respect to the amount of change dVref in the voltage of the node C is expressed as $dVB = dVref \times Cp/(Cp+C2)$. The node B including the pixel electrode 105 can include other capacitance components. Since the capacitance value C2 of the capacitance of the photoelectric conversion unit 120 is designed to be sufficiently higher than the other capacitance components, the capacitance value of the node B may be regarded to be substantially equal to the capacitance value C2 of the capacitance of the photoelectric conversion unit 120.

In the present exemplary embodiment, the amount of change dVB in the voltage of the pixel electrode 105 is sufficiently larger than a difference between the electrode driving voltage Vs of the upper electrode 101 and the reset voltage Vres (Vs−Vres). This makes the potential of the pixel electrode 105 lower than that of the upper electrode 101, and the gradient of the potential of the photoelectric conversion layer 103 is reversed. As a result, electrons represented by black circles are injected from the upper electrode 101 into the photoelectric conversion layer 103. All the holes accumulated as a signal charge at the interface between the photoelectric conversion layer 103 and the insulation layer 111 move toward the blocking layer 102. Since the holes serving as a signal charge are not trapped in a trap level, the holes can move quickly from the photoelectric conversion layer 103 to the blocking layer 102. The holes moved to the blocking layer 102 are combined with electrons, which are the majority carriers of the blocking layer 102, and disappear. As a result, the holes in the photoelectric conversion layer 103 are discharged from the photoelectric conversion layer 103. If the entire photoelectric conversion layer 103 is depleted, all the holes accumulated as a signal charge are discharged.

Next, in the state illustrated in FIG. 20C, the first voltage Vref1 is supplied to the node C at time t7. This reverses the gradient of the potential of the photoelectric conversion layer 103 again. The electrons injected into the photoelectric conversion layer 103 in the state of FIG. 20B are thus discharged from the photoelectric conversion layer 103. On the other hand, the blocking layer 102 suppresses the injection of holes from the upper electrode 101 into the photoelectric conversion layer 103. The surface potential of the photoelectric conversion layer 103 therefore changes according to the amount of accumulated holes. In response to the change in the surface potential, the voltage of the pixel electrode 105 changes from the reset state by a voltage Vp according to the amount of holes disappeared. In other words, the voltage Vp according to the amount of holes accumulated as a signal charge appears on the node B. The voltage Vp according to the amount of accumulated holes will be referred to as a light signal component.

In the state illustrated in FIG. 20C, the driving signal pTS(n) becomes a high level at time t8. The light signal S (Vp+Vres+kTC1) output from the amplification transistor 106 is held in the capacitor CTS of the column circuit 140 (S read). At time t9, the driving signal pTS(n) becomes a low level, and the S read ends.

A difference between the reset signal (Vres+kTC1) read in step (2) and the light signal S (Vp+Vres+kTC1) read in step (4) is the signal (light signal component) based on the voltage Vp according to the accumulated signal charge.

FIG. 20D illustrates the state of the photoelectric conversion unit 120 in step (5). In FIG. 20D, the reset signal pRES(n) becomes a high level at time t10, and the reset transistor 108 turns on. At the same time, the voltage Vref(n) is set to the reset voltage Vres, and the voltage of the node B is reset to the reset voltage Vres. At time t11, the reset signal pRES(n) becomes a low level, and the reset transistor 108 turns off. At the same time, the voltage Vref(n) is set to Vref1.

Here, reset noise (in FIG. 20D, noise kTC2) can also occur from the reset transistor 108. However, the reset noise occurring here can be removed by performing the reset operation of step (1) after the end of the accumulation period.

FIGS. 20E and 20F illustrate the state of the photoelectric conversion unit 120 in step (6). The electrode driving voltage Vs is supplied to the upper electrode 101. Since the electrode driving voltage Vs of the upper electrode 101 is higher than the reset voltage Vres, electrons in the photoelectric conversion layer 103 are discharged to the upper electrode 101. Meanwhile, holes in the photoelectric conversion layer 103 move toward the interface between the photoelectric conversion layer 103 and the insulation layer 111. If light is incident on the photoelectric conversion layer 103 in such a state, only holes of electron-hole pairs generated by photoelectric conversion are accumulated as a signal charge in the photoelectric conversion layer 103. After a predetermined period of accumulation, the operation of steps (1) to (6) is repeated.

The surface potential of the photoelectric conversion layer 103 changes due to the accumulated holes. The voltage of the pixel electrode 105 increases according to the change in the surface potential. In FIG. 20F, such an increase is represented by Vp0. As described above, during the resetting of FIG. 20A, the voltage of the pixel electrode 105 changes to cancel out the changed voltage Vp0. More specifically, the voltage of the pixel electrode 105 decreases. The surface potential of the photoelectric conversion layer 103 thus changes to increase.

If electrons are used as a signal charge, the second voltage Vref2 is a voltage lower than the first voltage Vref1. The gradients of the potentials in FIGS. 20A to 20F are therefore reversed. In other respects, the operation is the same.

An effect of noise reduction according to the present exemplary embodiment will be described. In the operation described with reference to FIGS. 20A to 20F, accumulated holes are discharged by reversing the gradient of the potential of the photoelectric conversion layer 103 in the state of FIG. 20B. If the gradient of the potential of the photoelectric conversion layer 103 is not able to be reversed, noise can occur due to the occurrence of an undischarged charge. The greater the amount of change dVB in the voltage of the pixel electrode 105 (node B) is as compared to a difference (Vs−Vres) between the electrode driving voltage Vs of the upper electrode 101 and the reset voltage Vres, the easier the gradient of the potential is to be reversed. In other words, the greater the amount of change dVB in the voltage of the pixel electrode 105 is as compared to the difference (Vs−Vres) between the electrode driving voltage Vs of the upper electrode 101 and the reset voltage Vres, the more noise can be reduced.

Even in the present exemplary embodiment, the drain of the reset transistor 108 and the second node of the capacitive element 109 are configured to be connected to the same power supply line and connected to the same voltage control unit 110. Like the first exemplary embodiment, the photoelectric conversion device according to the present exemplary embodiment can therefore also provide the effects of reducing the circuit area of the pixels 100 and reducing the wiring area of the pixel regions.

Figure 22:
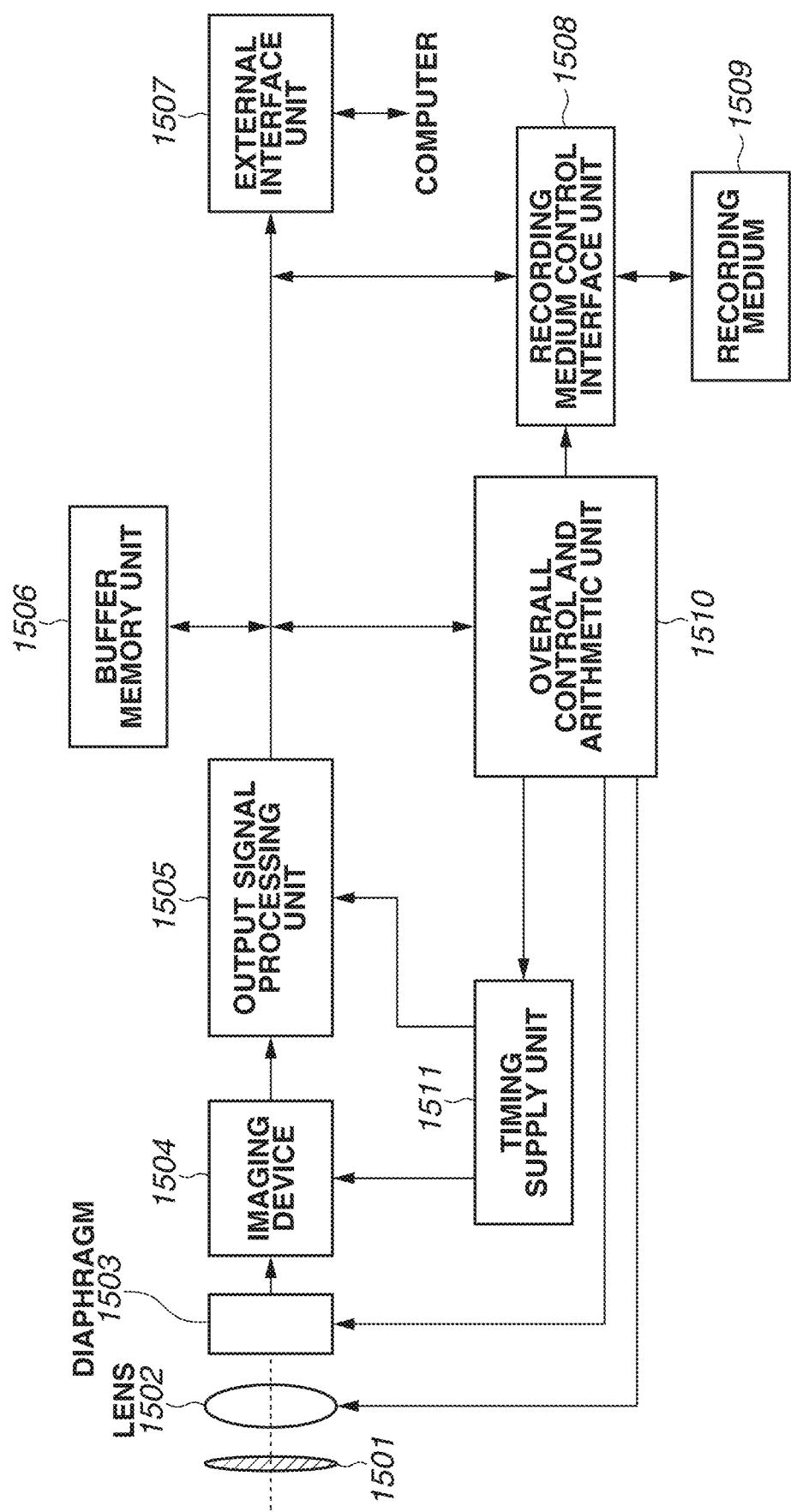
FIG. 22 is a diagram illustrating a configuration of an imaging system according to one or more aspects of the present disclosure.

An imaging system according to a sixth exemplary embodiment of the present disclosure will be described. Examples of the imaging system include a digital still camera, a digital camcorder, a camera head, a copying machine, a facsimile, a mobile phone, a vehicle-mounted camera, and an observation satellite. FIG. 22 illustrates a block diagram of a digital still camera as an example of the imaging system.

The present exemplary embodiment is directed to an imaging system that includes the photoelectric conversion device according to each of the foregoing exemplary embodiments as an imaging device 1504.

The imaging system illustrated in FIG. 22 includes a barrier 1501, a lens 1502, and a diaphragm 1503. The barrier 1501 is intended to protect the lens 1502. The lens 1502 forms an optical image of a subject on the imaging device 1504. The diaphragm 1503 is intended to make the amount of light passing through the lens 1502 variable. The lens 1502 and the diaphragm 1503 constitute an optical system for collecting light to the imaging device 1504. The imaging system illustrated in FIG. 22 includes an output signal processing unit 1505 which processes an output signal output from the imaging device 1504. The output signal processing unit 1505 performs an operation for performing various types of corrections and compression according to need, and outputting a signal.

The output signal processing unit 1505 performs an operation for generating an image by using the signal output from the imaging device 1504.

The imaging system illustrated in FIG. 22 further includes a buffer memory unit 1506 for temporarily storing image data, and an external interface unit 1507 for communicating with an external computer. The imaging system further includes a removable recording medium 1509 for recording or reading imaging data, and a recording medium control interface unit 1508 performing recording or reading on the recording medium 1509. Examples of the recording medium 1509 include a semiconductor memory. The imaging system further includes an overall control and arithmetic unit 1510 and a timing supply unit 1511. The overall control and arithmetic unit 1510 performs various calculations and controls the entire digital still camera. The timing supply unit 1511 outputs various timing signals to the imaging device 1504 and the output signal processing unit 1505. The timing signals may be input from outside. The imaging system can include at least the imaging device 1504 and the output signal processing unit 1505 which processes the output signal output from the imaging device 1504.

The overall control and arithmetic unit 1510 operates as a control unit for adjusting the level of the voltage Vs2 described in each of the foregoing exemplary embodiments according to a set exposure condition. For example, the overall control and arithmetic unit 1510 sets the level of the voltage Vs2 so that the photoelectric conversion unit 120 of a pixel 100 that has a median value in the dynamic range of the image under the set exposure condition is in a flat band state. The imaging device 1504 to which the photoelectric conversion device according to each of the exemplary embodiments is applied can thereby suitably implement the B mode according to the exposure condition.

In each of the pixels 100, a plurality of photoelectric conversion units 120 may be provided to correspond to one microlens. The output signal processing unit 1505 processes a signal based on a charge generated by some of the plurality of photoelectric conversion units 120 and a signal based on charges generated by the other photoelectric conversion unit(s) 120. The output signal processing unit 1505 can thereby obtain distance information about a distance from the imaging device 1504 to the subject. In other words, the output signal processing unit 1505 performs processing by using a signal based on a charge generated by part of the plurality of photoelectric conversion units 120 provided to correspond to one microlens and a signal based on a charge generated by another part of the photoelectric conversion units 120. By such processing, the output signal processing unit 1505 can obtain the distance information about the distance from the imaging device 1504 to the subject. In such a case, the output signal processing unit 1505 may obtain the signal based on the charge generated by another part of the photoelectric conversion units 120 by subtracting the signal based on the charge generated by part of the photoelectric conversion units 120 from a signal based on the sum of the charges generated by the plurality of photoelectric conversion units 120.

The output signal processing unit 1505 is provided on a second semiconductor substrate different from a first semiconductor substrate on which the imaging device 1504 is formed. The first semiconductor substrate and the second semiconductor substrate may be formed as respective different chips. The first and second semiconductor substrates may be stacked as a single chip.

In the foregoing example, the photoelectric conversion device used as the imaging device 1504 is described to include the AD conversion unit 204. In another example, the AD conversion unit 204 may be included in the output signal processing unit 1505. In such a case, the imaging device 1504 outputs an analog signal to the output signal processing unit 1505.

As described above, the imaging system according to the present exemplary embodiment can perform an imaging operation by applying the imaging device 1504.

In the present exemplary embodiment, the imaging device 1504 serving as the photoelectric conversion device and the AD conversion unit 204 are described to be provided on different semiconductor substrates. However, the imaging device 1504 serving as the photoelectric conversion device and the AD conversion unit 204 may be formed on the same semiconductor substrate. The imaging device 1504 and the output signal processing unit 1505 may be formed on the same semiconductor substrate.

The voltage control unit 110 described in each of the foregoing exemplary embodiments may be provided outside the imaging device 1504 serving as the photoelectric conversion device.

Figure 23A:
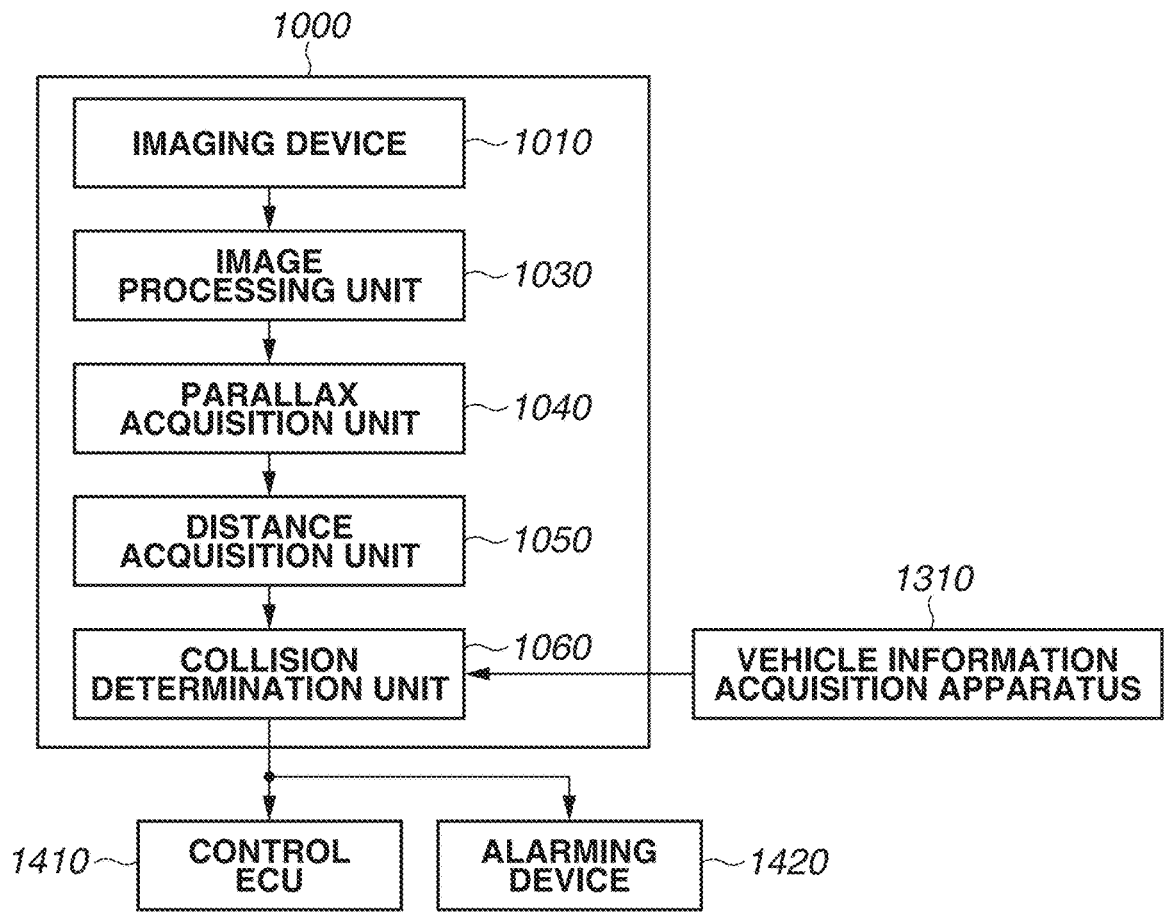
FIGS. 23A and 23B are diagrams illustrating a configuration of an imaging system according to one or more aspects of the present disclosure.

FIG. 23A illustrates an example of an imaging system related to a vehicle-mounted camera. An imaging system 1000 is an imaging system that includes the photoelectric conversion device according to each of the foregoing exemplary embodiments as an imaging device 1010. The imaging system 1000 includes an image processing unit 1030 and a parallax acquisition unit 1040. The image processing unit 1030 performs image processing on a plurality of pieces of image data obtained by the imaging device 1010. The parallax acquisition unit 1040 acquires a parallax (phase difference between parallax images) from the plurality of pieces of image data obtained by the imaging device 1010.

If the imaging system 1000 is configured as a stereo camera including a plurality of imaging devices 1010, the parallax can be acquired by using signals output from the respective plurality of imaging devices 1010. Alternatively, the imaging system 1000 may include an imaging device 1010 that includes a plurality of photoelectric conversion units 120 for one microlens. In such a case, the parallax acquisition unit 1040 acquires the parallax by processing a signal based on a charge generated by part of a plurality of photodiodes and a signal based on a charge generated by another part of the plurality of photodiodes. In other words, the parallax acquisition unit 1040 can acquire the parallax by using the signal based on the charge generated by part of the plurality of photoelectric conversion units 120 provided to correspond to one microlens and the signal based on the charge generated by another part of the photoelectric conversion units 120. In such a case, the signal based on the charge generated by another part of the photoelectric conversion units 120 may be obtained by subtracting the signal based on the charge generated by part of the photoelectric conversion units 120 from a signal based on the sum of charges generated by the plurality of photoelectric conversion units 120.

The imaging system 1000 includes a distance acquisition unit 1050 and a collision determination unit 1060. The distance acquisition unit 1050 acquires a distance to a subject based on the acquired parallax. The collision determination unit 1060 determines whether there is a possibility of collision based on the acquired distance. The parallax acquisition unit 1040 and the distance acquisition unit 1050 are examples of a distance information acquisition unit for acquiring distance information about a subject. The distance information is information about a parallax, a defocus amount, and a distance to the subject. The collision determination unit 1060 may determine the possibility of collision by using any one of such pieces of distance information. The distance information acquisition unit may be implemented by exclusively designed hardware, by a software module, or by a combination of these. The distance information acquisition unit may be implemented by a field programmable gate array (FPGA) or an application specific integrated circuit (ASIC). The distance information acquisition unit may be implemented by a combination of an FPGA and an ASIC.

The imaging system 1000 is connected with a vehicle information acquisition apparatus 1310, and can acquire vehicle information such as vehicle speed, yaw rate, and a steering angle. The imaging system 1000 is also connected with a control engine control unit (ECU) 1410 which is a control unit that outputs a control signal for causing the vehicle to generate braking force based on a determination result of the collision determination unit 1060. The imaging system 1000 is also connected with an alarming device 1420 which issues an alarm to the driver based on the determination result of the collision determination unit 1060. For example, if the determination result of the collision determination unit 1060 shows a high possibility of collision, the control ECU 1410 performs vehicle control to avoid a collision or reduce damage by applying the brake, easing up on the accelerator, and/or suppressing engine output. The alarming device 1420 warns the user by issuing alarming sound, displaying alarming information on a screen of a car navigation system, and/or applying vibrations to the seat belt or steering wheel.

In the present exemplary embodiment, the imaging system 1000 captures an image around the vehicle, for example, in front of or behind the vehicle.

Figure 23B:
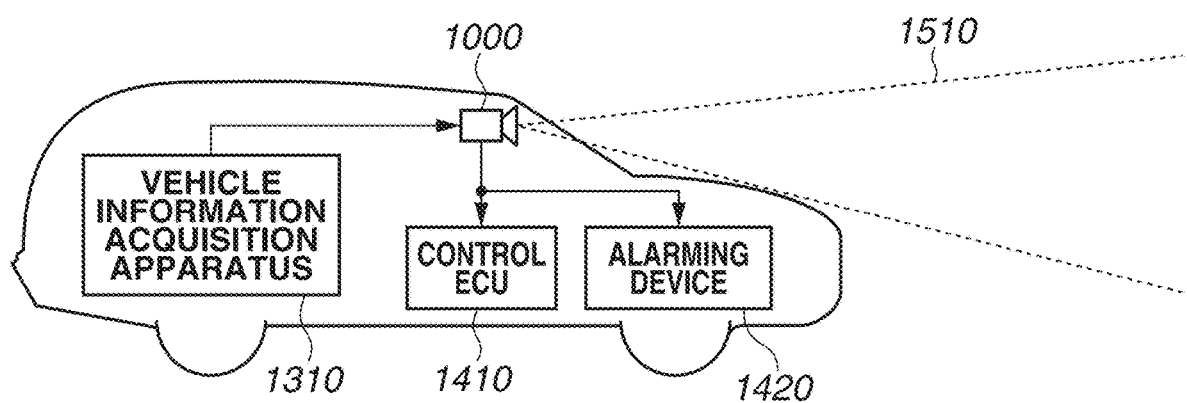

FIG. 23B illustrates the imaging system 1000 that captures an image in front of the vehicle. In the foregoing description, controls to avoid collision with another vehicle are described. However, the imaging system 1000 may be applied to controls for automatic driving to follow another vehicle, or controls for automatic driving to not go out of the lane. The imaging system 1000 is not limited to vehicles such as an own vehicle, and may be applied to moving bodies (moving apparatuses) such as a ship, an aircraft, and an industrial robot. The imaging system 1000 is not even limited to moving bodies, and may be widely applied to apparatuses that use object recognition, such as an intelligent traffic system (ITS).

All the foregoing exemplary embodiments are merely examples of embodiment in carrying out the present disclosure, and the technical scope of the present disclosure should not be interpreted to be limited thereto. An exemplary embodiment of the present disclosure may be carried out in various forms without departing from the technical concept or main features thereof. The exemplary embodiments described above may be implemented in various combinations.

While the present disclosure has been described with reference to exemplary embodiments, the scope of the following claims is to be accorded the broadest interpretation so as to encompass all such modifications and equivalent structures and functions.

This application claims the benefit of Japanese Patent Application No. 2016-254364, filed Dec. 27, 2016, which is hereby incorporated by reference herein in its entirety.

What is claimed is:

1. A photoelectric conversion device comprising:
a semiconductor substrate; and
a pixel,
the pixel including
a photoelectric conversion unit including a first electrode, a second electrode arranged between the first electrode and the semiconductor substrate, and a photoelectric conversion layer arranged between the first electrode and the second electrode,
an amplification transistor,
an impurity diffusion portion connected to the second electrode and a gate of the amplification transistor,
a reset transistor configured to, if turned on, reset a voltage of the impurity diffusion portion, and
a capacitive element including a first node and a second node, the first node being connected to the impurity diffusion portion,
wherein the photoelectric conversion device further comprises a voltage control unit connected to the second node and the reset transistor via a piece of wiring and configured to output a plurality of voltages having different values to the piece of wiring, and
wherein the amplification transistor is switched on and off by input of the plurality of voltages to the impurity diffusion portion via the capacitive element.

2. The photoelectric conversion device according to claim 1, wherein the pixels are arranged in a plurality of rows and a plurality of columns.

3. The photoelectric conversion device according to claim 2,
wherein the voltage control unit is configured to supply a first voltage to the piece of wiring in an accumulation period of the photoelectric conversion layer,
wherein the voltage control unit is configured to supply a second voltage that is a voltage having a value different from that of the first voltage to the piece of wiring in a period in which the amplification transistor outputs a signal, and
wherein the first voltage is a voltage at which the amplification transistor is turned off.

4. The photoelectric conversion device according to claim 1,
wherein the voltage control unit is configured to supply a first voltage to the piece of wiring in an accumulation period of the photoelectric conversion layer, and
wherein the voltage control unit is configured to supply a second voltage that is a voltage having a value different from that of the first voltage to the piece of wiring in a period in which the amplification transistor outputs a signal.

5. The photoelectric conversion device according to claim 4,
wherein the impurity diffusion portion is formed in contact with a semiconductor region to which a predetermined voltage is applied, and
wherein the first voltage is a voltage equal to the predetermined voltage.

6. The photoelectric conversion device according to claim 1,
wherein a charge of the photoelectric conversion layer is accumulated in the impurity diffusion portion via the second electrode,
wherein the photoelectric conversion unit includes a blocking layer between the photoelectric conversion layer and the second electrode, and
wherein the blocking layer is configured to suppress injection of a charge, which has polarity opposite to that of the charge that the photoelectric conversion layer outputs to the second electrode during the accumulation period, from the second electrode into the photoelectric conversion layer.

7. The photoelectric conversion device according to claim 1,
wherein the photoelectric conversion unit includes an insulation layer between the photoelectric conversion layer and the second electrode, and
wherein a voltage corresponding to a charge accumulated in the photoelectric conversion layer is output to the second electrode.

8. An imaging system comprising:
the photoelectric conversion device according to claim 1; and
a signal processing unit configured to generate an image by using a signal output from the photoelectric conversion device.

9. The imaging system according to claim 8,
wherein the pixel includes a microlens and a plurality of the photoelectric conversion units arranged to correspond to the microlens, and
wherein the signal processing unit is configured to generate distance information about a subject by using a signal based on a charge generated by part of the plurality of the photoelectric conversion units and a signal based on a charge generated by another part of the plurality of the photoelectric conversion units.

10. A moving body comprising:
the photoelectric conversion device according to claim 1;
a distance information acquisition unit configured to acquire distance information about a distance to a subject, based on a signal from the photoelectric conversion device; and
a control unit configured to control the moving body based on the distance information.

* * * * *